United States Patent
Zinman et al.

(10) Patent No.: US 6,534,748 B1
(45) Date of Patent: Mar. 18, 2003

(54) SEMICONDUCTOR PURIFICATION APPARATUS AND METHOD

(75) Inventors: Yosef Zinman, Tel Aviv (IL); Arie Ravid, Kiriat Bialik (IL); Yossef Raskin, Kiryat Bialik (IL); Lev Schoichet, Carmiel (IL); Alex Sergienko, Karmiel (IL); Ilya Roitman, Kefar Vradim (IL)

(73) Assignee: Sizary Ltd., Migdal (IL)

( * ) Notice: Subject to any disclaimer, the term of this patent is extended or adjusted under 35 U.S.C. 154(b) by 0 days.

(21) Appl. No.: 09/647,189

(22) PCT Filed: Mar. 28, 1999

(86) PCT No.: PCT/IL99/00179

§ 371 (c)(1),
(2), (4) Date: Feb. 15, 2001

(87) PCT Pub. No.: WO99/50888

PCT Pub. Date: Oct. 7, 1999

Related U.S. Application Data

(60) Provisional application No. 60/079,807, filed on Mar. 30, 1998.

(30) Foreign Application Priority Data

Feb. 14, 1999 (IL) .................................. 128523

(51) Int. Cl.$^7$ .................................................. F27B 5/14
(52) U.S. Cl. ........................ 219/390; 219/405; 219/411; 118/724; 118/725; 118/728; 118/50.1; 392/416
(58) Field of Search ................................ 219/390, 405, 219/411; 392/416, 418; 118/724, 725, 50.1, 728, 723 R, 723 VE, 723 E, 625, 628, 638–639

(56) References Cited

U.S. PATENT DOCUMENTS

| | | | | |
|---|---|---|---|---|
| 4,723,508 A | * | 2/1988 | Yamazaki et al. | 118/723 |
| 4,870,245 A | * | 9/1989 | Price et al. | 219/121.36 |
| 5,868,848 A | * | 2/1999 | Tsukamoto | 118/723 E |
| 6,177,356 B1 | | 1/2001 | Zinman et al. | |

\* cited by examiner

*Primary Examiner*—Teresa Walberg
*Assistant Examiner*—Shawntina T. Fuqua
(74) *Attorney, Agent, or Firm*—Eitan, Pearl, Latzer & Cohen-Zedek

(57) ABSTRACT

A method for protecting at least one wafer from contamination, the method including the steps of heating the wafer in an apparatus for semiconductor processing having a reaction core (102), providing a first voltage level to a wafer transfer device (108), and providing a second voltage level lower than the first voltage level, near the reaction core (102), thereby activating the protection.

31 Claims, 20 Drawing Sheets

SEMICONDUCTOR PURIFICATION APPARATUS AND METHOD

This is application claims the benefit of provisional application No. 60/079807, filed Mar. 30, 1998.

FIELD OF THE INVENTION

The present invention relates generally to methods and apparatus for purifying semiconductor wafers, and to such methods and apparatus for cleaning and/or protecting wafers from contamination in particular.

BACKGROUND OF THE INVENTION

The silicon wafers used in the production of semiconductor integrated circuits must be very clean, because even small amounts of undesirable contaminating impurities can cause complete degradation or malfunction of Integrated circuits. Thus, the wafers must be cleaned between processing steps, and once cleaned, protected from future recontamination. In silicon semiconductor production there exist a number of equipment and associated processes for silicon wafer cleaning and/or protection from contamination.

SUMMARY OF THE PRESENT INVENTION

The present invention provides an improved apparatus and method for protecting silicon wafers in semiconductor processing and production.

There is therefore provided in accordance with a preferred embodiment of the present invention a method for protecting at least one wafer from contamination. The method includes heating the wafer in an apparatus for semiconductor processing having a reaction core, providing a first voltage level to the wafer, and providing a second voltage level lower than the first voltage level, near the reaction core, thereby activating the protection.

The method also includes the step of heating the wafer in a semiconductor furnace. The method additionally includes the step of operating a cooling system within the apparatus and/or pulling a vacuum within the apparatus.

There is therefore additionally provided in accordance with a preferred embodiment of the present invention an apparatus for protecting at least one wafer from external contamination. The apparatus includes a reaction core which processes the wafer, a heating element and a means for supplying an electrical potential.

The heating element is located on the outside of the reaction core and heats-up the wafer and the reaction core. The means for supplying an electrical potential supplies a first voltage level to the at least one wafer and a second voltage level, lower than the first voltage level, near the reaction core, Preferably the reaction core is located within equipment for semiconductor production. Additionally preferably the reaction core is located within equipment for silicon wafer processing, such as a semiconductor furnace.

Preferably the apparatus also includes a cooling system which cools the reaction core. The cooling system preferably includes at least one blower. The heating element preferably has one or more IR lamps.

The apparatus additionally preferably includes a grid-shaped core collector electrode wrappable around the outside of the reaction core. The electrode is preferably formed of a thermo-stable material such as Aluchrom or Silicon Carbide.

The apparatus furthermore preferably includes a vacuum pump, which draws a vacuum within the reaction core.

There is therefore additionally provided in accordance with a preferred embodiment of the present invention, a wafer transfer device for holding a plurality of wafers within a furnace having a door. The device includes a support and at least one electrode.

The support is formed of Silicone Carbide (SiC), and has a base and a plurality of prongs. Each one of the plurality of wafers stands between a pair of the plurality of prongs. The electrode supplies an electrical potential to the support. The electrode is also preferably made from silicone carbide (SiC) and has a comb-like shape.

The device also includes a hook and a protrusion extending from the door. The hook is connected to the support and hooks to the protrusion, thereby suspending the device therefrom. Preferably the hook is made from quartz.

There is therefore additionally provided in accordance with a preferred embodiment of the present invention, a furnace which minimizes contamination of at least one silicone wafer processed therein. The furnace includes at least one feed-through interface and at least one electrode extension.

The feed-through interface passes though an associated opening in the furnace, such that the first end of the interface is outside of the furnace and the second end extends into the furnace. The first end is connectable to and electrode which receives an electrical potential.

The electrode extensions is connectable to the second end of an associated interface and extends from that feed-through interface into the furnace. The interface seals the opening and prevents electrical potential from leaking from the extension.

The furnace also includes a wafer transfer device which holds the wafer and is connectable to at least one electrode extension, thereby receiving the electrical potential therefrom.

Alternatively preferably the furnace is vertical or horizontal.

The furnace also includes a reaction core which processes the wafer. The furnace also has at least one feed-through interface passing though an associated at least one opening in the furnace door, and sealing the opening.

The furnace door preferably includes a door-insulating unit. The opening is preferably either at the top or at the bottom of the furnace.

The furnace also includes a liner which acts as a core collector fbr the contamination.

There is therefore additionally provided in accordance with a preferred embodiment of the present invention, a feed-through interface which carries an electrical potential. The interface includes conductive tip, a conductive spring, an electrode extension and a high temperature body.

The tip is connectable to a power supply which supplies the electrical potential. The spring has a first end and a second end, wherein the first end is connected to the tip. The electrode extension is connected to the second end of the spring, such that the potential of provided from the tip to the spring to the electrode extension. The high temperature body, preferably made from ceramic, surrounds the interface and prevents the electrical potential from leaking.

BRIEF DESCRIPTION OF THE DRAWINGS

The present invention will be understood and appreciated more fully from the following detailed description taken in conjunction with the drawings in which.

DETAILED DESCRIPTION OF THE PREFERRED EMBODIMENTS

In silicon semiconductor production there exist a number of equipment, and associated processes, for silicon wafer cleaning and subsequent protection. Example of such cleaning/protection apparatus and process are described in U.S. patent application Ser. No. 09/090,742 (now U.S. Pat. No. 6,177,356) and European Patent Publication EP-A-0749153, assigned to the common owners of the present invention, and included herein by reference.

European Patent Publication EP-A-0749153 describes a cleaning method which utilizes an electric field in the presence of heat to move positively charged impurity ions from the semiconductor wafer surface and above it towards a negatively charged electrode (called the "collector").

Figure 1:
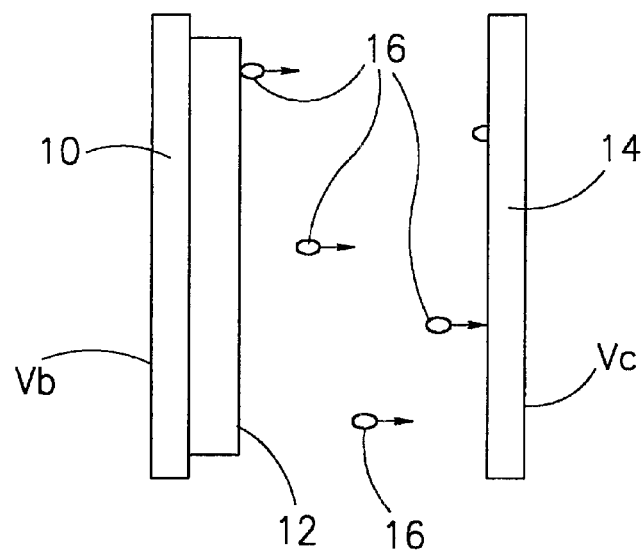
FIGS. 1 and 2 are schematic illustrations of prior art thermoemission systems for cleaning and protecting wafers, respectively.

The apparatus of European Patent Publication EP-A-0749153 is schematically illustrated in FIG. 1 to which reference is now briefly made. The electric field is created between the electrodes, one of which, labeled 10, is attached to the wafer 12 to be cleaned. The other electrode (the "collector"), labeled 14, is placed at a distance therefrom. Wafer electrode 10 is connected to a voltage source output Vb and the collector 14 is connected to another source output Vc, where the potential Vc is more electronegative than the potential Vb.

Thus, an electric field is created to move positive ions, labeled 16, from the wafer area toward the collector electrode 14, where positive ions will be absorbed (captured). Typically, the apparatus is placed in a vacuum or in presence of a gas mixture and heated to initiate ion emission from the wafer surface. EP Publication EP-A-0749153, also describes utilizing a plasma between the two electrodes 10 and 14 to strengthen the electric field over the wafer surface.

U.S. patent application Ser. No. 09/090,742 assigned to the common owners of the present invention, describes a method for protecting wafers from contamination during processing using an apparatus similar to that of EP Publication EP-A-0749153.

Figure 2:
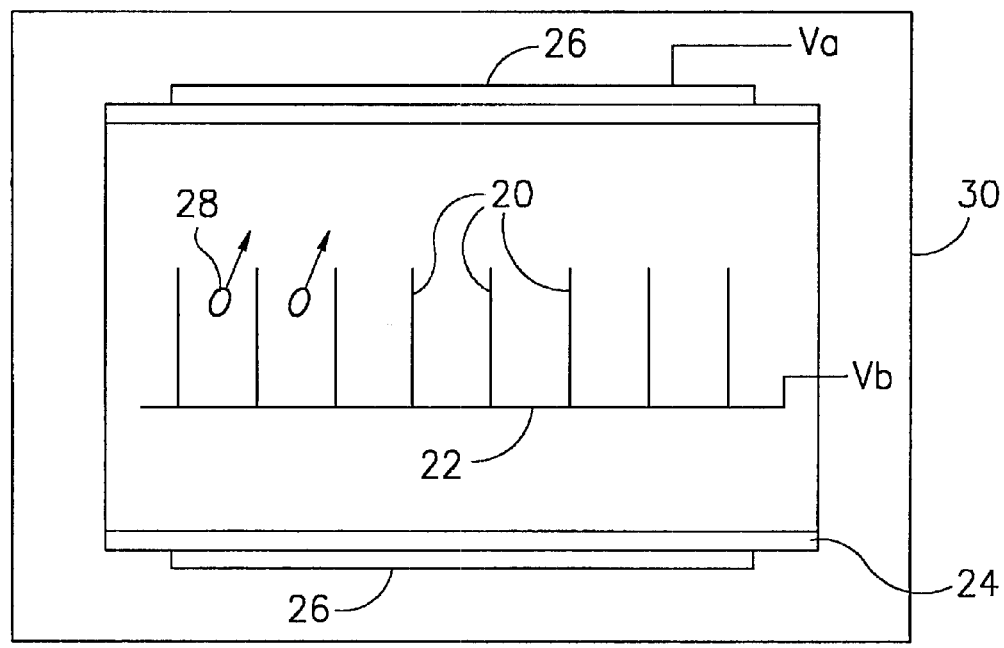

The apparatus of U.S. patent application Ser. No. 09/090,742 is shown in FIG. 2 and shows wafers 20, which are to be cleaned, attached to an at least partially conductive, transfer device 22 connected to wafer voltage source Vb. The transfer device 22 is placed into a reaction core 24 on the outside of which a core collector 26 is mounted. Core collector 26 is connected to a core voltage source Va.

In the presence of heat and the electric field generated between wafers 20 and core collector 26 (and, if desired, in the presence of a conductive medium), ions 28 move out of both sides of the wafers 20 and are collected by core collector 26. This apparatus also cleans the reaction core 24 since core collector 26 is mounted on the outside of reaction core 24, and since the wafer voltage Vb is greater than the core voltage source Va.

Alternatively, the negative electrical potential described hereinabove may be applied during high temperature processes. Unlike other contamination control technologies which use chlorine sources such as Trans-LC, the above described apparatuses and processes do not use chemical additives, and are not dependent on specific ambient composition.

Hence, the negative electrical potential prevents migration of elemental ionic contamination to the silicon wafers during processing, and is especially useful in processing equipment, such as a diffusion furnace. The sources of contamination in a diffusion furnace can be diffuison from (or through) the process tube walls, out-diffusion from the cantilever or wafer transfer boats, and impurities in the process gas.

The process described in U.S. patent application Ser. No. 09/090,742 is most commonly used in diffusion furnaces. However, alternative embodiments are applicable for other applications of semiconductor manufacture, such as, Rapid Thermal Process (RTP), Epitaxial growth reactor etc.

Figure 3:
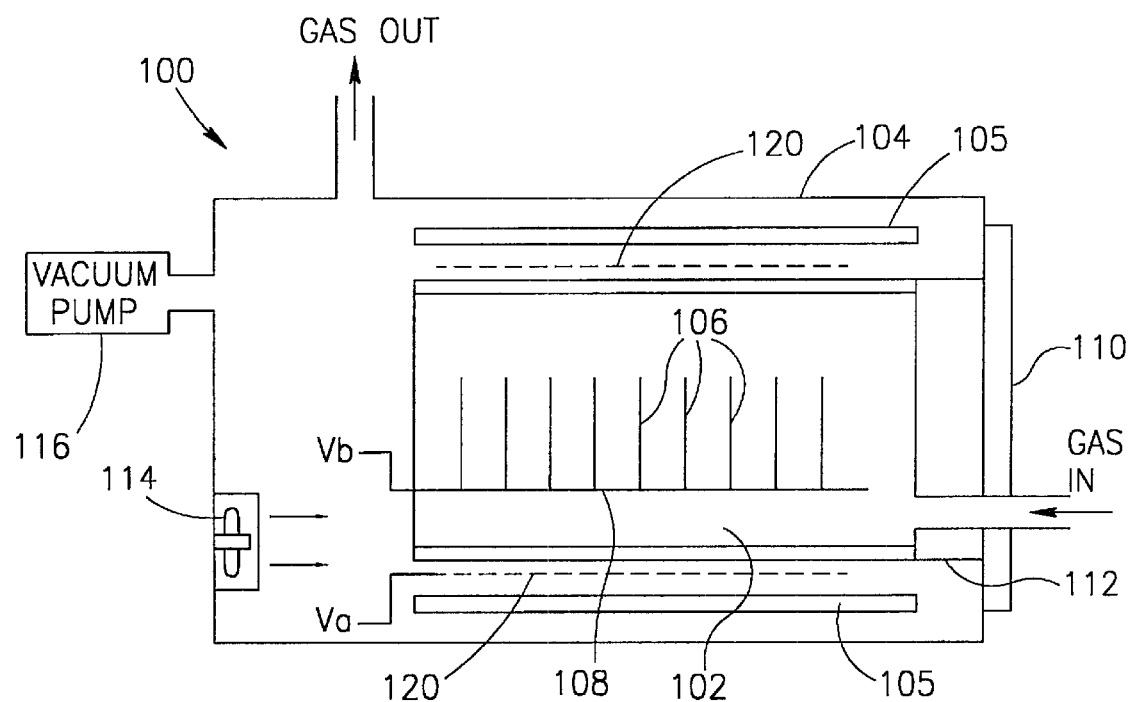
FIG. 3 is a schematic illustration of a semiconductor furnace operative in accordance with a preferred embodiment of the present invention.
Figure 4:
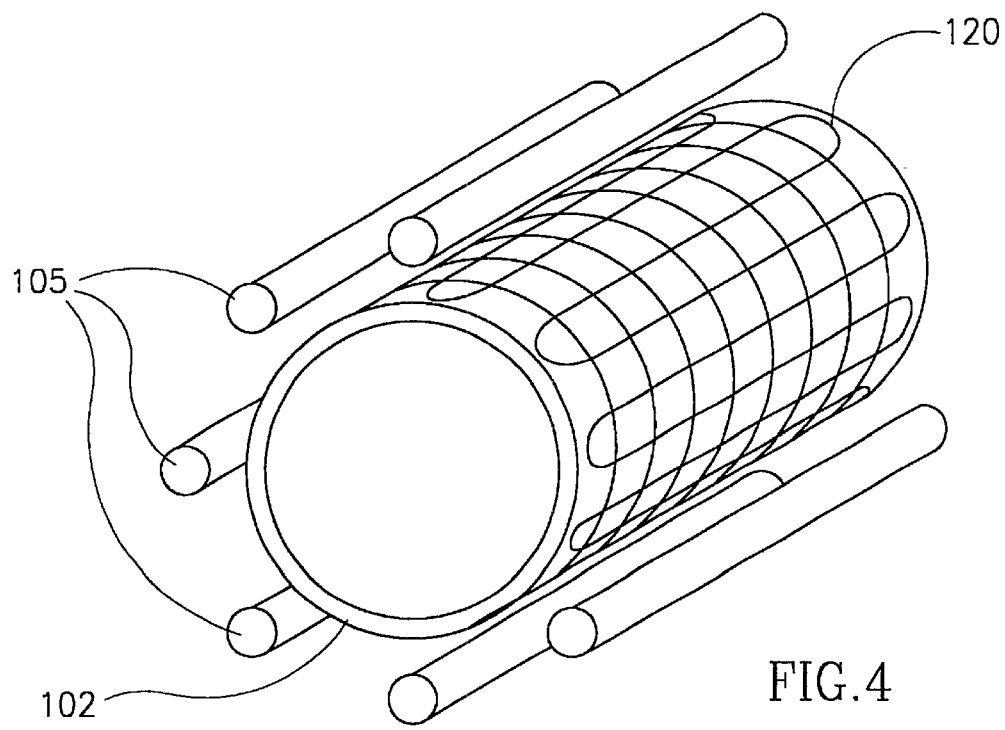
FIG. 4 is an isometric illustration of a portion of the semiconductor furnace of FIG. 3.

Reference is now made to FIG. 3, which illustrates the apparatus installed in a semiconductor furnace, such as a mini-batch semiconductor furnace. Reference is also made to FIG. 4, which isometrically illustrates a part of the furnace.

The furnace has a housing 104, onto which is mounted a cylinder quartz formed reaction core 102, around which are arranged, a plurality of infrared (IR) lamps 105. For purposes of clarity, FIG. 3 shows only two lamps while FIG. 4 shows more. Through the reaction core 102, typically formed of quartz, the IR lamps 105 heat a batch of semiconductor wafers 106. It should be noted that although descriptions herein refer to a reaction core, alternatively reaction core 102 is replaceable with a Reaction Process Tube, (RTP) a Rapid Thermal Process chamber, or the like.

Typically, the wafers 106 are mounted on a transfer device 108 of some kind, such as a boat, paddle, carrier, etc., typically formed of quartz or silicon carbide (SiC), with which the batch of wafers 106 are transferred.

The housing 104 includes a door 110 to which a bell jar 112 is connected, at least one blower 114 and a suction outlet which leads to a vacuum pump 116. The bell jar 112 seals the reaction core 102 once the door 110 is closed. Alternatively, the vacuum pump 116 provides a vacuum within housing 104 and blower 114 is used to cool down the IR lamps 105 after the heating process has finished. Different manufacturers alternately refer to bell jar 112 as a pedestal.

In accordance with a preferred embodiment of the present invention, a core collector 120 is mounted on the outside of reaction core 102. Core collector 120 is connected to the core voltage source Va and wafer electrodes forming part of the transfer device 108 are connected to the wafer voltage source Vb. The core collector 120 is shown in more detail in FIG. 4.

FIG. 4 is an isometric of the reaction core 102, some of the IR lamps 105 and the core collector 120. As shown, core collector 120 is a grid of wires wrapped around reaction core 102. For example, the wires can be made of Aluchrom, manufactured by Goodfellow Cambridge Ltd. of England, or any other thermo-stable material applicable for air-medium environments. The size of the grid can vary as long as sufficient right passes through the grid to heat the wafers (not shown) inside the reaction core 102. Alternatively, the grid is replaceable by a SiC liner.

Alternatively, reaction core 102 is a double wall quartz forming a reaction core set (not shown in FIG. 4). In such a case, grid-shaped core collector 120 is inserted in between the external and the internal walls of reaction core 102. Alternatively, the entire reaction core 102 and collector 120 assembly are formed of SiC. Further alternatively, reaction core 102 is a quartz wall, and collector 120 is an electrical electrode hooked-up to heating element 105.

In operation, the core collector 120 and the wafer electrodes of the transfer device 108 are connected to their respective voltages. The IR lamps 105 are turned on 9 and heat is transferred to the wafers 106 within the reaction core 102. The ions (not shown) leave the wafers 106 to be collected by core collector 120.

Applicants have realized that at high temperatures, the quartz of the reaction core 102 is easily contaminated, particularly from the materials of the housing, such as thermal insulation or heating element. This contamination reduces the quality of the protection of the wafers since it reduces the quartz's ability to receive free ions pulled from within the reaction core 102 when the core collector 120 and the wafer electrodes of the transfer device 108 are operated.

Applicants have realized that cooling the outside of the reaction core 102 minimizes its contamination. Therefore, in accordance with a further preferred embodiment of the present invention, the blower(s) 114, or any other cooling device, are operated at least whenever the core collector 120 and wafer electrodes of the transfer device 108 receive voltage from their voltage sources Va and Vb, respectively. Typically, this occurs at least during the processing period and often during the entire process. Thus the cooling of reaction core 102 reduces the emission ions from the reaction core itself, and from the sources of contamination located out of the reactor.

It will be appreciated that the movement of cooled air does not affect the heating of the wafers 106, since the wafers are heated by the radiation of the heating elements (IR lamps 105), nor does it affect the quality of the radiation.

Alternatively, reaction core 102 can be kept cool via other methods, such as gas flow cooling and the like. Furthermore, the contamination minimization operation can occur during the heating up and cooling down of the furnace.

It is noted that implementation of the hereinabove described processes in the semiconductor furnace reduces the potential of additional contamination during anneal processes. The present invention additionally cleans/protects the wafer from contamination, thereby resulting in high levels of cleanliness in the oxide layers, without the use of chlorine. Furthermore, the present invention provides extended operation at higher temperatures and improves minority-carrier diffusion-length after high temperature anneal.

In a preferred embodiment of the present invention, the wafer transfer device 108 is also cleaned via the process described hereinabove, thus reducing the out-diffusion from the device to the wafers.

Figure 5A:
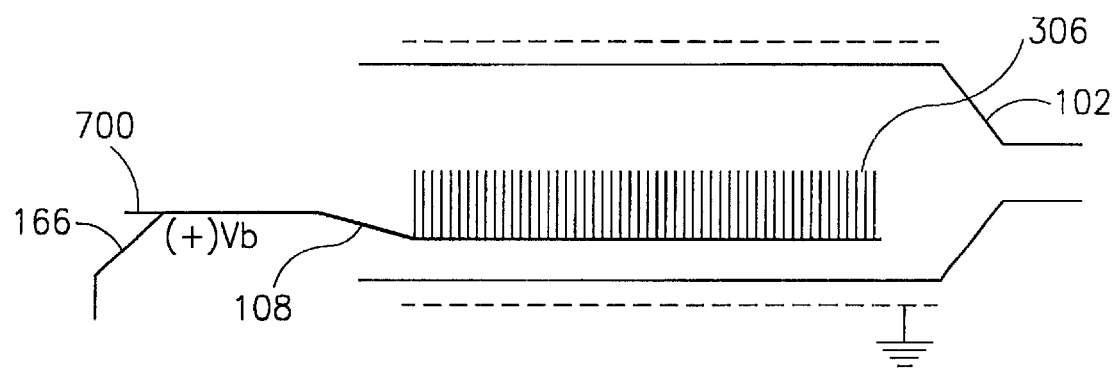
FIG. 5A is a schematic illustration of a preferred embodiment of the present invention in a horizontal furnace.
Figure 5B:
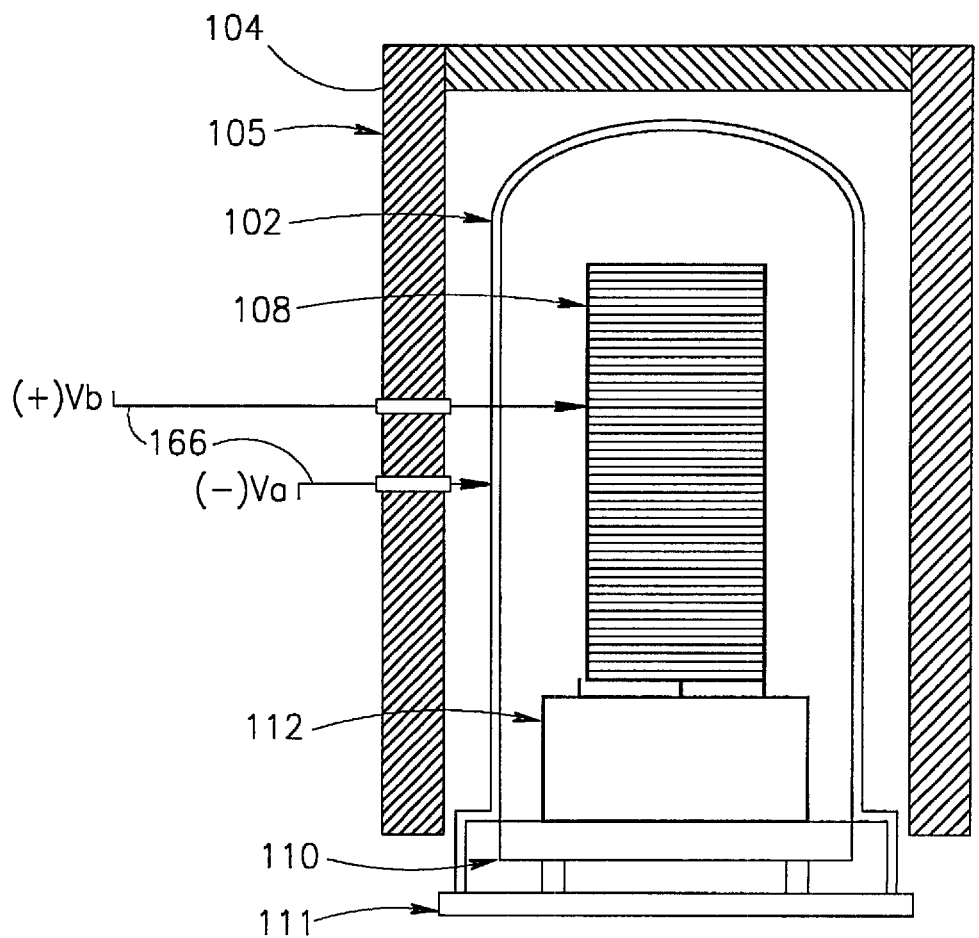
FIG. 5B is a schematic illustration of a preferred embodiment of the present invention in a vertical furnace.

Reference is now made to FIGS. 5A and 5B, which illustrates a typical furnace change assembly (FCA) configuration for a horizontal semiconductor furnace and a vertical semiconductor furnace, respectively. The description hereinbelow is applicable to the embodiments of both FIGS. 5A and 5B.

Elements similar to those used in previous embodiments have similar reference numerals, and will not be further described hereinbelow. It is noted that although the description herein refers to a FCA configuration, the description is also applicable to a furnace tube assembly (FTA). It is additionally noted that the embodiments hereinbelow employ the above described process of cleaning/protecting with a negative electrical potential.

Voltage supplies Va and Vb are carried by electrode extensions 166 and received by reaction core 102 and wafer device 108, respectively. In a preferred embodiment, electrode extensions 166 are standard appliances available with reaction core 102, and typically a path is formed through the core 102 enabling a high voltage cable to be fed through the electrode extensions 166. Reaction core 102 is preferably made from SiC or quartz and alternatively acts as the collector electrode.

Hence, typically positive voltage Vb is received by wafer transfer device 108, and negative or ground voltage Va is delivered to reaction core 102. The reaction core 102 is thus more negative than the wafer transfer device 108, pulling the icons outward from the device, and thus protects the wafers carried by wafer transfer device 108. It is noted that in FIG. 5A, wafer transfer device 108 is replaceable by a parallel device known as a cantilever paddle 700.

In some applications (not shown) a reverse polarity may be applied, i.e. a negative voltage (Va) is delivered to the transfer device 108 and a GND potential (Vb) is delivered to the reaction core 102. The negative voltage applied to device 108 pulls ions from reaction core 102, thus cleaning the reaction core 102, which itself may have become, over time, a source of contamination as well. Both of these embodiments are further discussed in FIGS. 10A and 10B, hereinbelow.

Figure 6A:
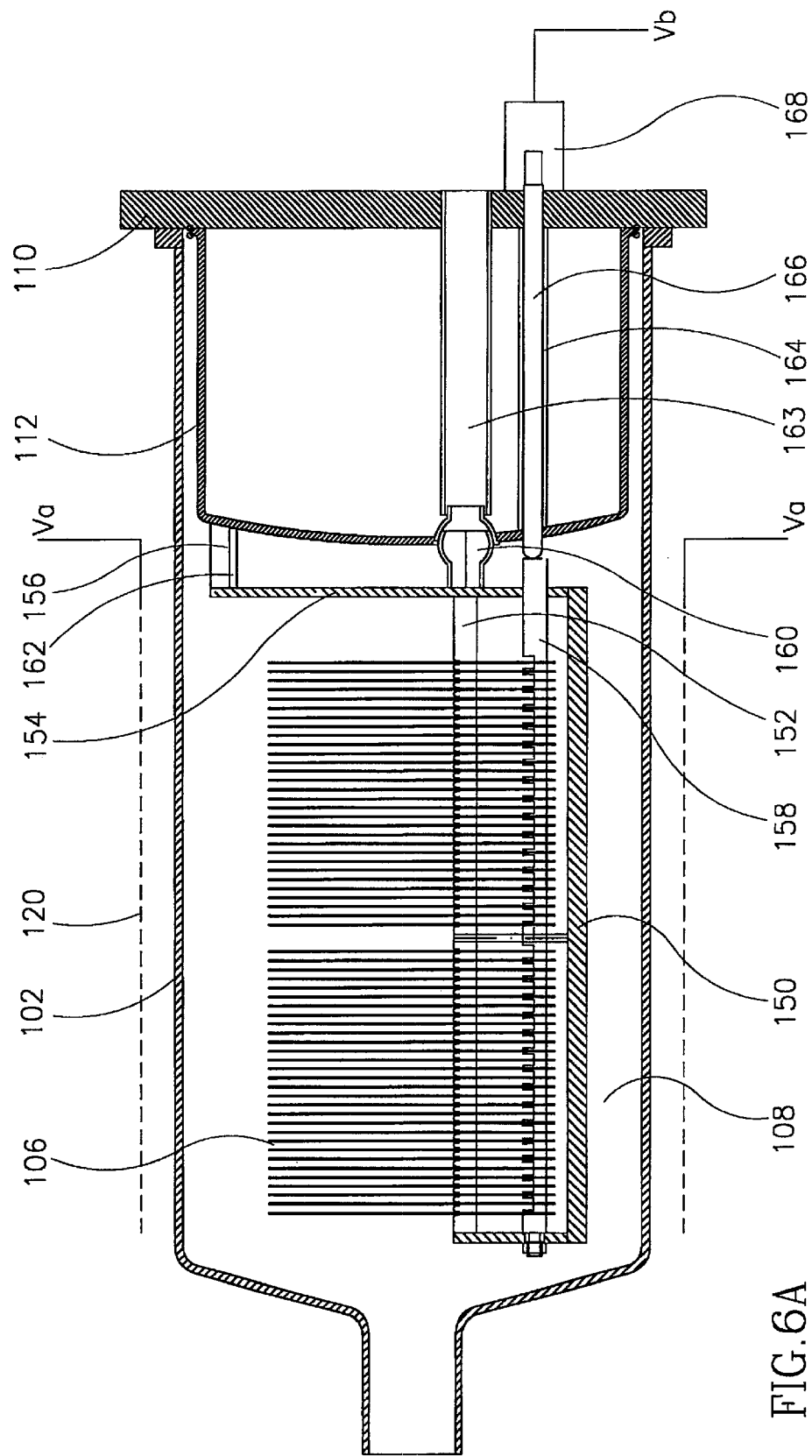
FIG. 6A is a cross-section illustration of a wafer transfer device mounted within the reaction core of a semiconductor furnace.
Figure 6B:
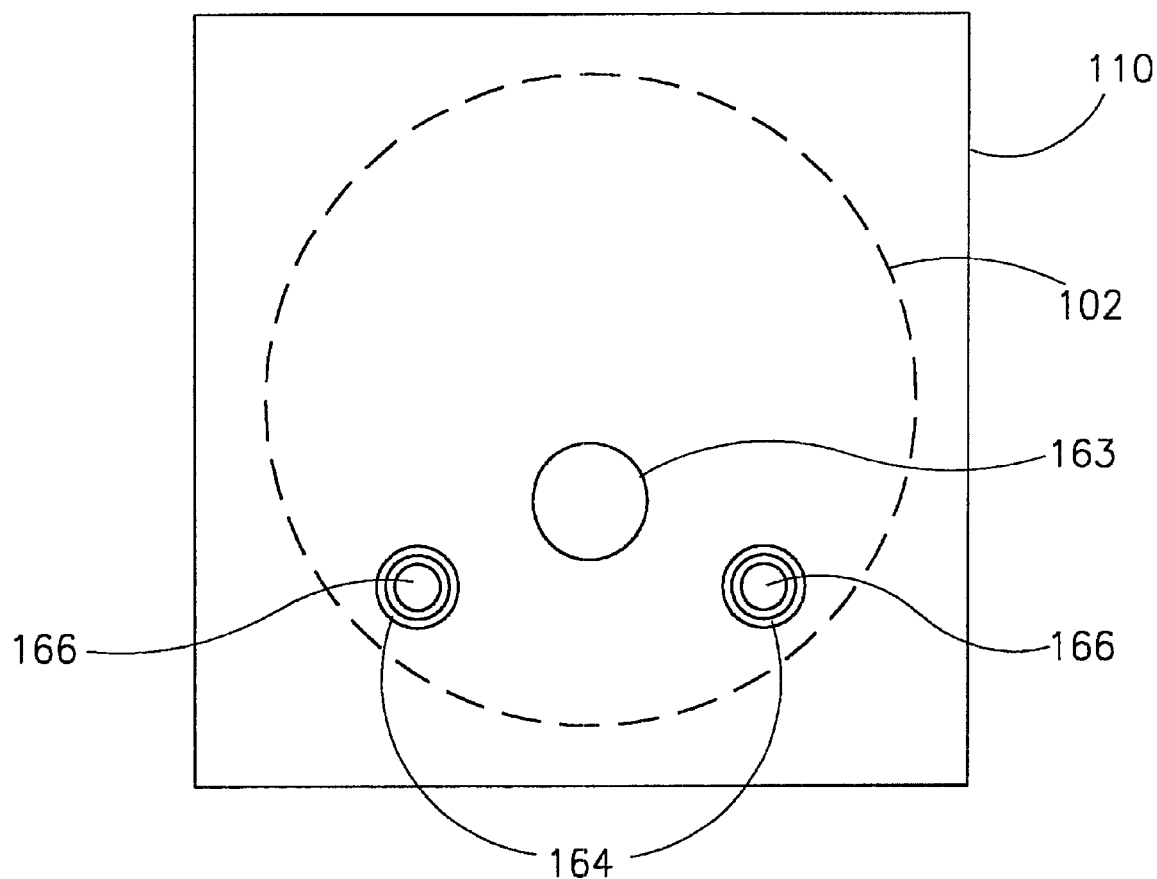
FIG. 6B is a schematic illustration of cavities mounted within a door of the semiconductor furnace of FIG. 6A.

Reference is now made to FIGS. 6A and 6B, which illustrate an exemplary embodiment of wafer transfer device 108 as connected to bell jar 112 within reaction tube 102, and a front view of door 110.

In this embodiment, wafer transfer device 108 is a comb-like device having a base 150, at least two wafer support rods 152, a hook 154 ending in a protrusion 156, two wafer electrode rods 158 and an optional ball joint connection 160. Base 150, wafer supports 152, hook 154, and protrusion 156 are typically made of quartz or silicone carbide, while wafer electrodes 158 and electrode extensions 166 are made of silicon carbide. Wafer supports 152 and wafer electrode rods 158 are typically comb-like, such that each wafer 106 is separately held by one "tooth" of the wafer electrodes 158 and stands between two "teeth" of the comb-like wafer supports 152.

The bell jar 112 is connected to furnace door 110, and typically comprises on the internal side of the bell jar, a protrusion 162 of a shape to hold the protrusion 156 of hook 154. For example, the protrusion 156 can be a flat surface, as shown, or a cupped element. It will be appreciated that hook 154 suspends the wafer transfer device 108 within the reaction core 102.

Bell jar 112 also comprises electrode extensions cavities 164 made of quartz, though which the electrode extensions 166 are placed, and a gas cavity 163, through which gas is passed, As seen in FIG. 6B, the electrode extensions cavities 164, typically formed of quartz, are on either side of the gas cavity 163. Optional ball connection 160, of wafer transfer device 108, typically tightly connects to gas cavity 163 and provides for the sealed flow of gas. It will be appreciated that ball connection 160 can help stabilize wafer transfer device 108 and ensure that wafer electrode rods 152 have sufficient contact with electrode extensions 166.

Electrode extensions 166, in turn, are connected to a power supply Vb via door feed-through interfaces 168, placed on the outside of door 110. It will be appreciated that electrodes 158, electrode extensions 166, and door feed-through interfaces 168 provide the power supply Vb, (which is typically positive) to the wafers 106.

The core collector electrode 120 can be of any type, an example of a grid electrode has bee n shown hereinabove in FIG. 4. Core collector electrode 120 is is connected to the Va power supply, (which is typically negative) through a wire typically passed through the side walls (connection on the net side) of reaction core 102.

Cavities 164, electrode extensions 166 and feed-through interfaces 168 are described in more detail hereinbelow in FIG. 9.

Figure 7A:
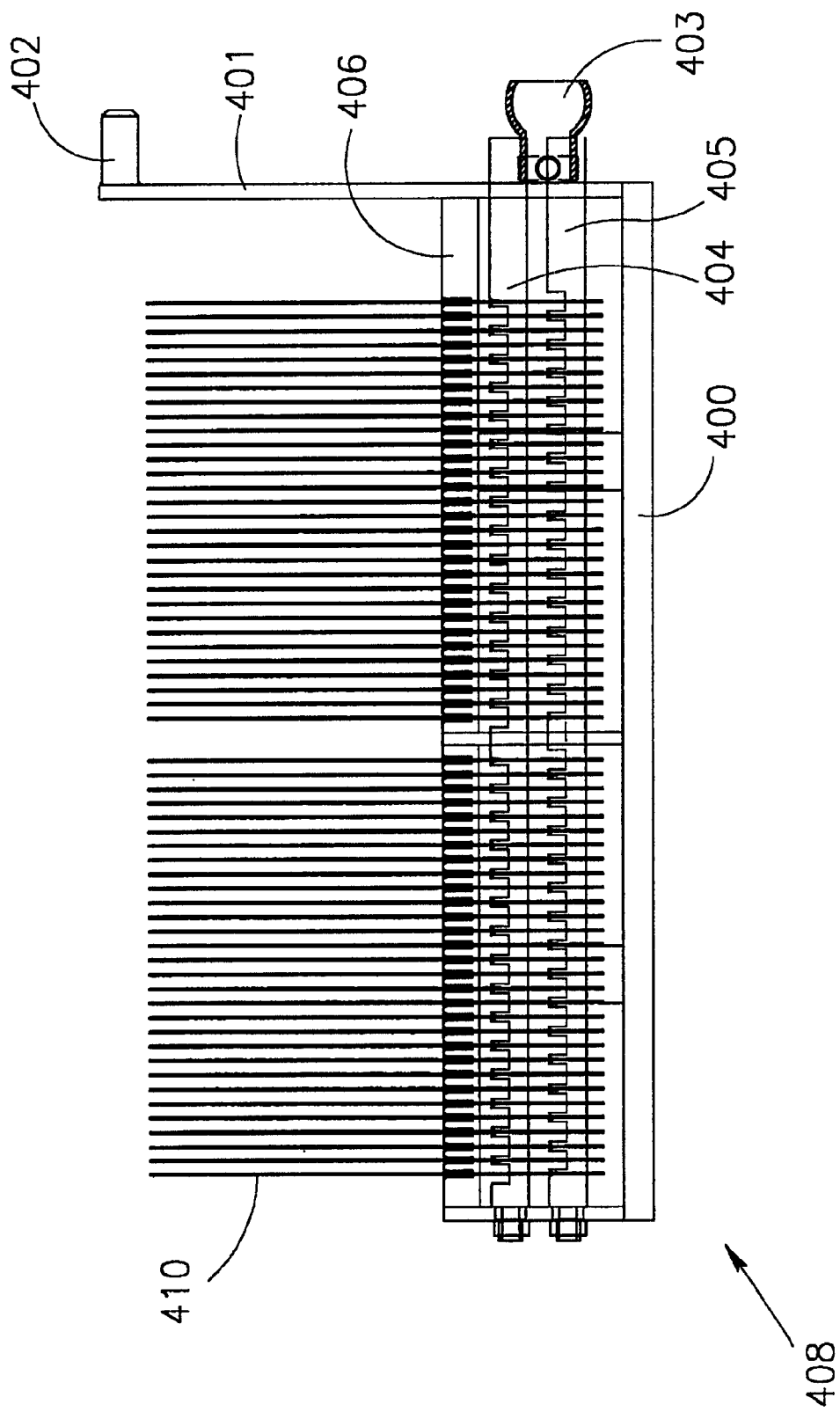
FIGS. 7A is a schematic illustration, similar to FIG. 6A, of an alternative embodiment of a wafer transfer device.
Figure 7B:
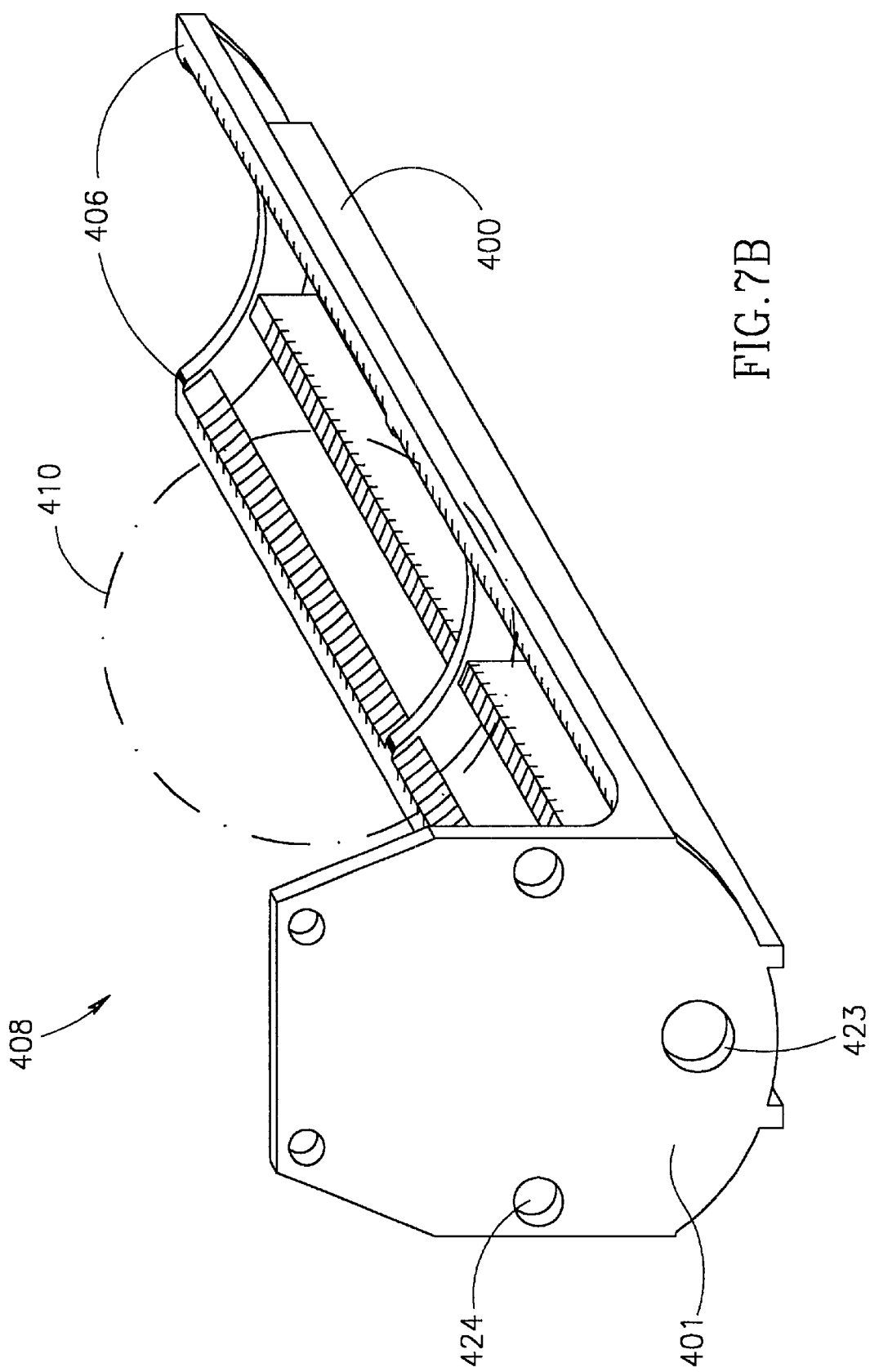
FIG. 7B is an isometric illustration of the device of FIG. 7A.

Reference is now briefly made to FIGS. 7A and 7B, which illustrate an alternative wafer transfer device 408, operative according to an alternative is preferred embodiment of the present invention.

In this embodiment, wafer transfer device 408 has a base 400, two wafer support rods 406, a hook 401 ending in a protrusion 402, and two wafer electrode rods 404 and an optional ball joint connection 403. The base 400, wafer supports 406, hook 401, and protrusion 402 are typically made of quartz. The wafer electrode rods 404 are typically made of SiC. Both wafer electrodes 404 and wafer supports 406 have comb-like shapes to separately hold the wafers 410. Alternatively, wafer supports 406 are made of SiC.

FIG. 7B is a cross sectional view of device 408 and shows cavities 424 and 423, through which electrode rods 404 and ball joint connection 403 (FIG. 7A), respectively, are placed.

The comb-like shape electrode rods 404 may be mounted via cavities 424, which is standard for the proper wafer size. Alternatively, rods 404 may be shifted one pitch relative to each pair of wafers.

In this way a skilled person can hook-up a full batch of wafers in odd slots for technology as illustrated in FIG. 6A. Alternatively a half batch of wafers can be hooked up in even slots as per the technology illustrated in FIG. 7A. In the latter case the other half batch of odd wafers are used as the collectors.

The voltage sources for the embodiment described in FIGS. 7A and 7B are hooked-up as previously described hereinabove. The gas flows into device 408 via a gas diffusion device (not shown) which diffuses the gas symmetrically via an inlet in ball-joint 403.

Figure 8A:
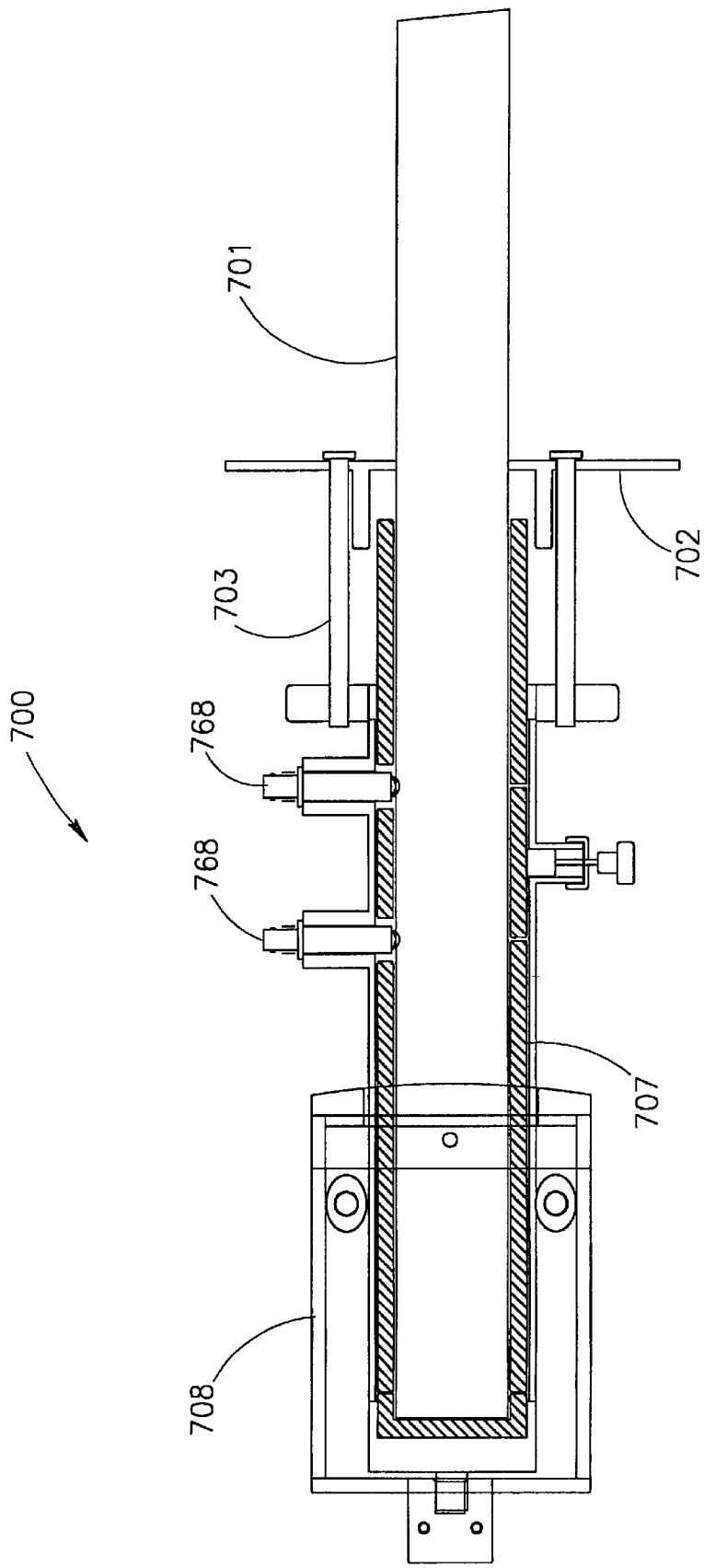
FIG. 8A is a schematic illustration of a preferred embodiment of a paddle integrated with a wafer transfer mechanism, useful in the embodiment of FIG. 5A.

Reference is now made to FIG. 8A which illustrates cantilever paddle 700 which can be implemented in a typical FCA of a horizontal furnace, as illustrated in FIG. 5A, to which reference is now briefly made.

Transfer device 700 is preferably implemented as an upgrade to an existing wafer transfer device, such as device 108. Alternatively, device 700 can be manufactured as an original item, as shown in FIG. 8A, and thus upgrade modifications are not required.

Transfer device 700 has a modified paddle 701 which receive a positive electrical potential. and thus acts as an internal electrode. Handle 701 is mounted into, and held in place by, a stainless steel head 708. Paddle 700 transfers wafers 306 from outside of a reaction core 102 into the hot environment inside the core. Alternatively, wafers 306 are exposed to a uniform temperature and electrical field while moving into reaction core 102.

Transfer device 700 is sealed into the reaction core 102 via a quartz door 702 which is sealed onto one end of the core 102, and via a stainless steel door (not shown) that seals onto the furnace stainless steel frame.

Door 702 is supported by one or more support rods 703. Rods 703 are spring loaded, and hence expand and contract to compensate for temperature changes between the sealed quartz door 702 and the outer stainless steel door. Preferably, the support rods 703 are formed of quartz.

A ceramic sleeve 707 formed around paddle 701 isolates an operator from a positive potential received by paddle 701 and a negative potential received by stainless steel head 708. Ceramic sleeve 707 is preferably made from more than one ceramic piece, thus producing less mechanical friction during normal operation and thermal processing, and able to withstand high voltages as well as high temperatures.

One or more feed-through interfaces 768 supply the electrical potential to paddle 701. Interfaces 768 are resistant to high temperature environments, and provide a tight seal against any gas leakage, which may occur.

Feed-through interfaces 768 are preferably employed as a pair; one of pair supplies the electrical potential to the paddle 701, while the other one supplies feedback to a controller (not shown).

Figure 8B:
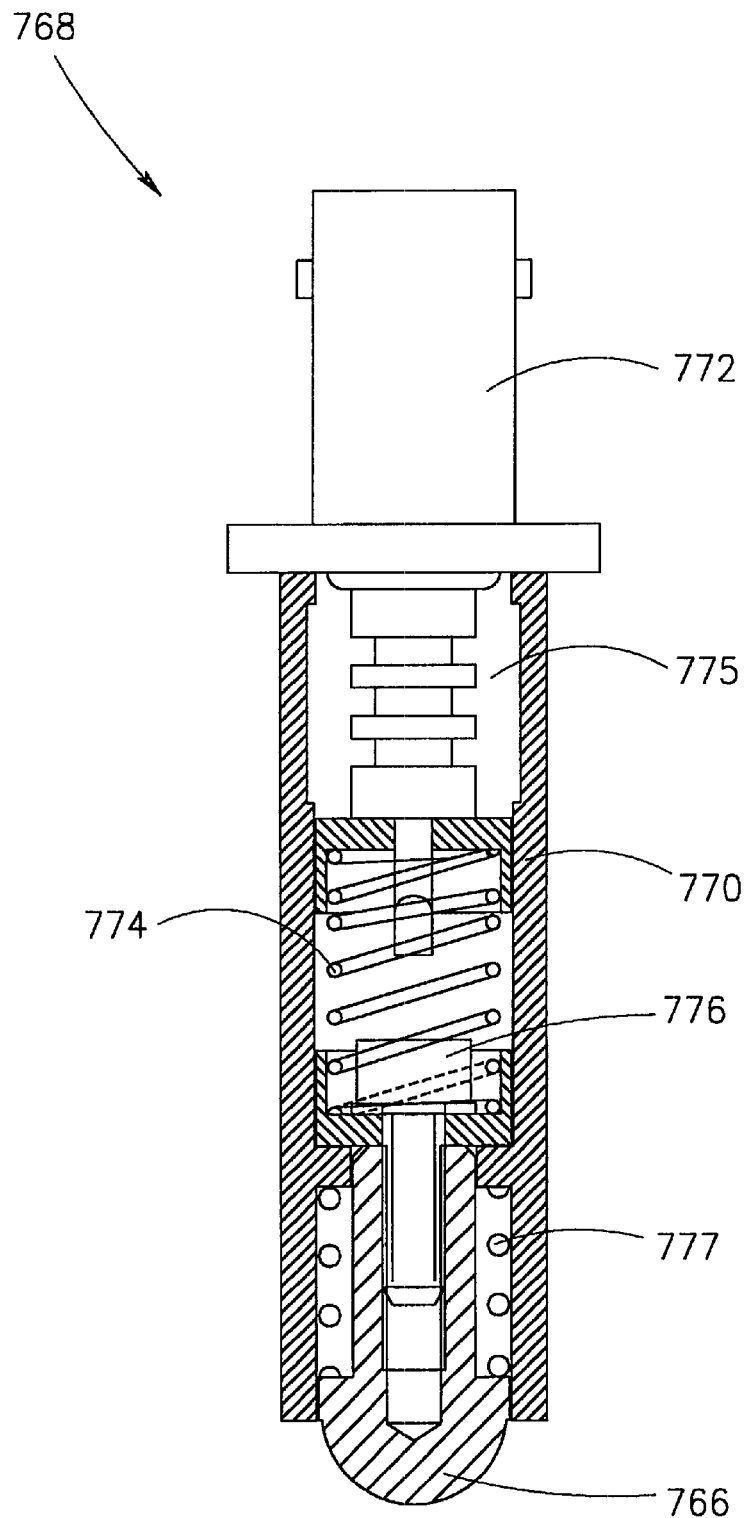
FIG. 8B is a cross section illustration of a feed-through interface employable with a paddle of FIG. 8A.

Reference is made to FIG. 8B, a detailed illustration of feed-through interface 768, connectable to paddle 701 via cavities in ceramic sleeve 707.

Each feed-through interface 768 comprises a ceramic body 770, an electrical connector 766, typically formed of stainless steel, and a metal spring 774, which provides a flexible conductive connection between a connector 772 and an inner end 776 of stainless steel electrode extension 766.

The power supply (not shown) is typically connected to connector 772 via a standard high voltage coaxial cables connection. Interface 768 preferably also includes a second spring 777, and alternatively, also a wire connected (not shown) between connector 772 and end 776, which provides additional electrical contact between connector 772 and end 776.

Preferably in order to ensure a secure mechanical connection, ceramic body 770 is glued to the metal connector 772 with a high temperature and high voltage resistance ceramic glue.

Feed-through interface 768 is attached to paddle 701 via four screws (not shown) located in the stainless steel body of connector 772.

Figure 9:
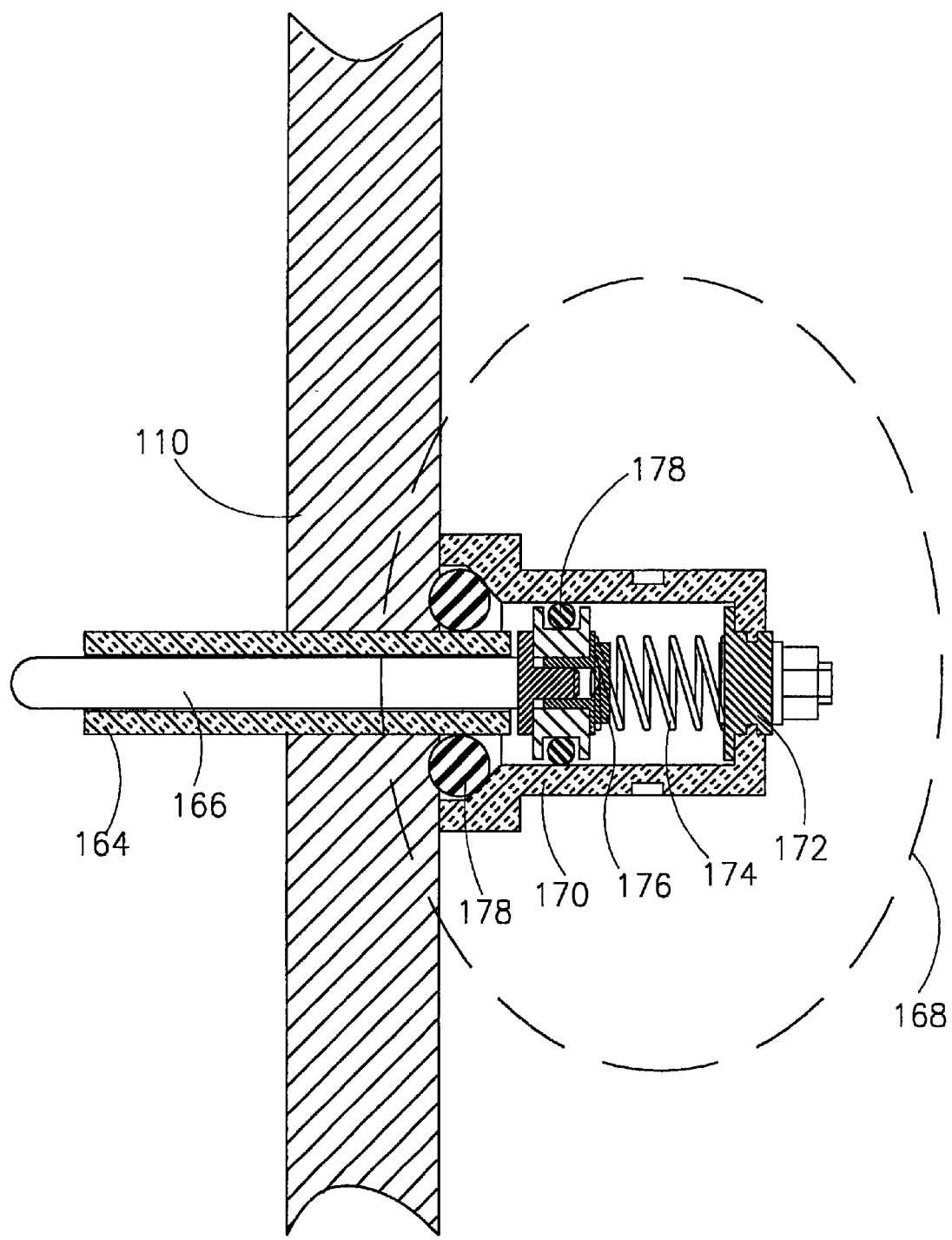
FIG. 9 is a cross-section illustration of a feed-through interface, connected to a door, useful in the device of FIG. 6A.

FIG. 9 details an exemplary door feed-through interface 168, as initially illustrated in FIG. 6B. Typically two interfaces 168 are used, one through each of the two cavities 164 (as shown in FIG. 6B). Each door feed-through interface 168 comprises a ceramic body 170, an electrical stainless steel connector 172, typically formed of silicon carbide, "O"-rings 178, and a metal spring 174 between connector 172 and an end 176 of the SiC electrode extension 166. The power supply (not shown) is typically connected to connector 172.

Feed-through interface 168, similar to all the feed through interfaces described herein, are preferably made of highly conductive materials, such as stainless steel etc. Preferably the body is made of insulating materials, such as ceramic, quartz, which protect against high voltage and/or gas leakage, and are resistant to high temperatures and corrosive gas environments.

"0"-rings 178 ensure that the feed-through interface 168 seals the cavity 164. Spring 174 flexibly connects between end portion 176 of the electrode extension 166, and the connector 172, thereby compensating for any movement of electrode extension 166 due to the significant heat generated in the furnace. Spring 174, which is metallic, also provides electrical connection between electrode extension 166 and connector 172.

Ceramic body 170, formed of a high temperature ceramic, forms an housing around the other elements of the feed-through interface 168. This minimizes contamination in cavities 164 and insulates the internal elements of feed-through interface 168 from the heat generated by the furnace.

The ceramic body 170 also electrically isolates the feed-through interface 168 from any electrical activity on the door 110.

Ceramic body 170 is held against the door 110 by a flange (not shown) which is screwed into screw holes (not shown) of the door 110. It is noted that the combination of the wafer electrodes 158, electrode extensions 166 and door feed-through interfaces 168 provide a continuous electrical connection without the use of thin wires, and in the presence of a wide range of temperatures. It additionally noted that the use of feed-through interface 168 is appropriate for other preferred embodiments described herein.

Figure 10A:
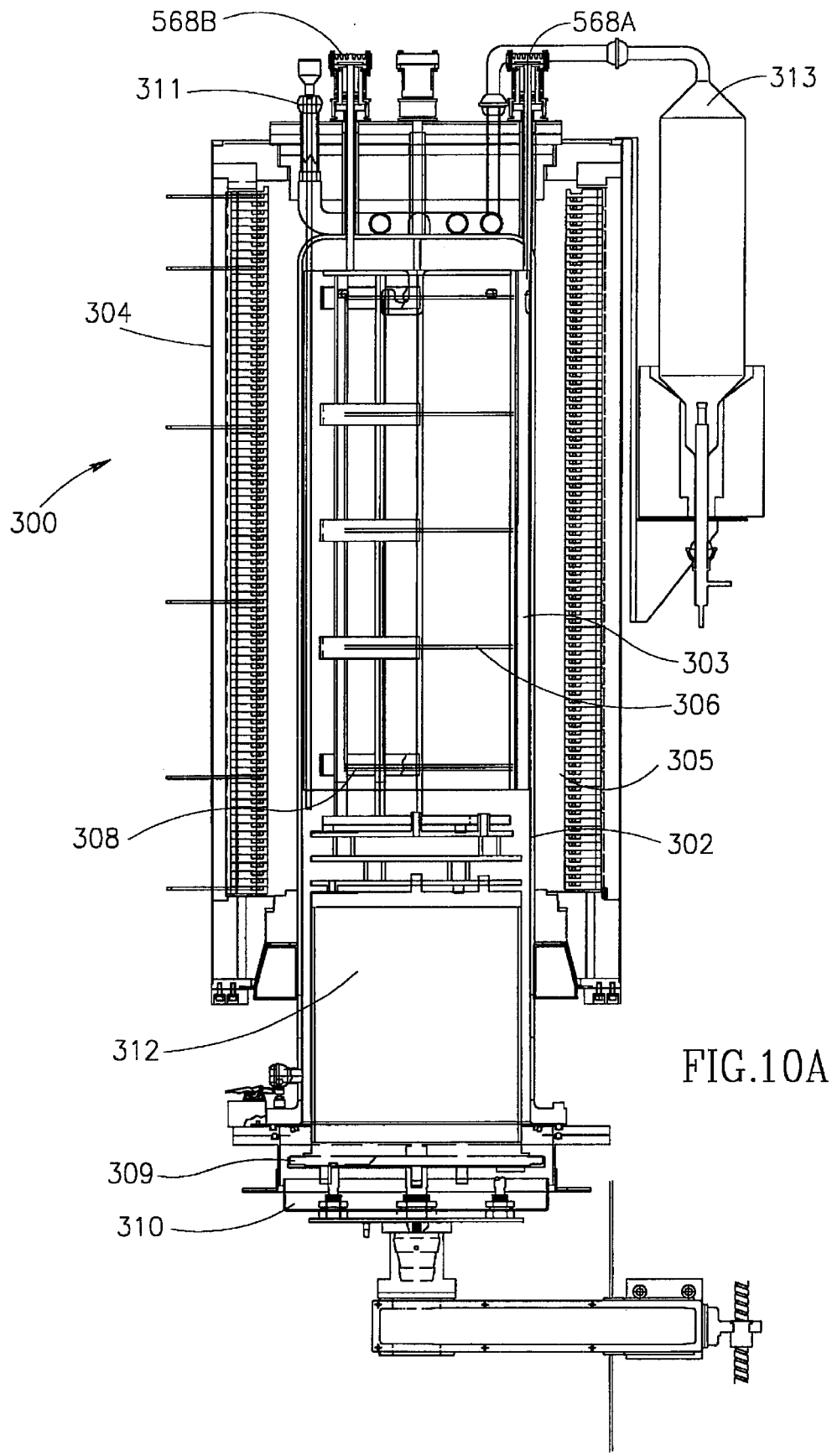
FIG. 10A is a schematic illustration of a top mounted system with an internal integrated liner within a vertical semiconductor furnace, operative in accordance with a preferred embodiment of the present invention.

Reference is now made to FIG. 10A, which is a schematic illustration of a preferred embodiment of the present invention implemented in a typical FCA in a vertical semiconductor furnace 300 having one reaction core 302.

Furnace 300 comprises a housing 304, into which is mounted reaction core 302. In a preferred embodiment, reaction core 302 is a quartz tube around which is arranged a resistive heater element 305. Through the reaction core 302, heater element 305 heats a batch of semiconductor wafers 306. Typically, the wafers 306 are mounted on a wafer transfer device 308, preferably formed of SiC. Device 308 functions in a manner similar to devices 108 and 408 described hereinabove, and will not be further described.

The housing 304 includes a door assembly 310 to which a quartz pedestal 312 is connected. Once door 310 is closed, pedestal 312, which may alternatively be a bell jar, seals reaction core 302.

In an alternative embodiment, the similar furnace optionally employs a thermo-couple (T/C) quartz sheath 311. In a further embodiments, a gas feed assembly 313 is hooked up to reaction core 302 for suppling a gas therein.

Furnace 300 additionally comprises an inner SiC liner 303 mounted on the inside of reaction core 302. Electrical potential is supplied to liner 303 and wafers device 308 via feed-through interfaces, 568A and 568B, generally referenced 568.

It is noted that SiC liner 303, suspended in the hull of core 302, acts as a core collector, and hence, is hooked up to a negative voltage, via first feed-through interface 568A, mounted at the top of furnace 300. The wafer electrodes of the transfer device 308 are connected to a positive voltage, via second feed-through interface 568B. also mounted at the top of furnace 300.

Heater element 305 is turned on and heat is transferred to the wafers 306 within reaction core 302. The ions (not shown) leave the wafers 306 and are collected by SiC liner 303.

Figure 10B:
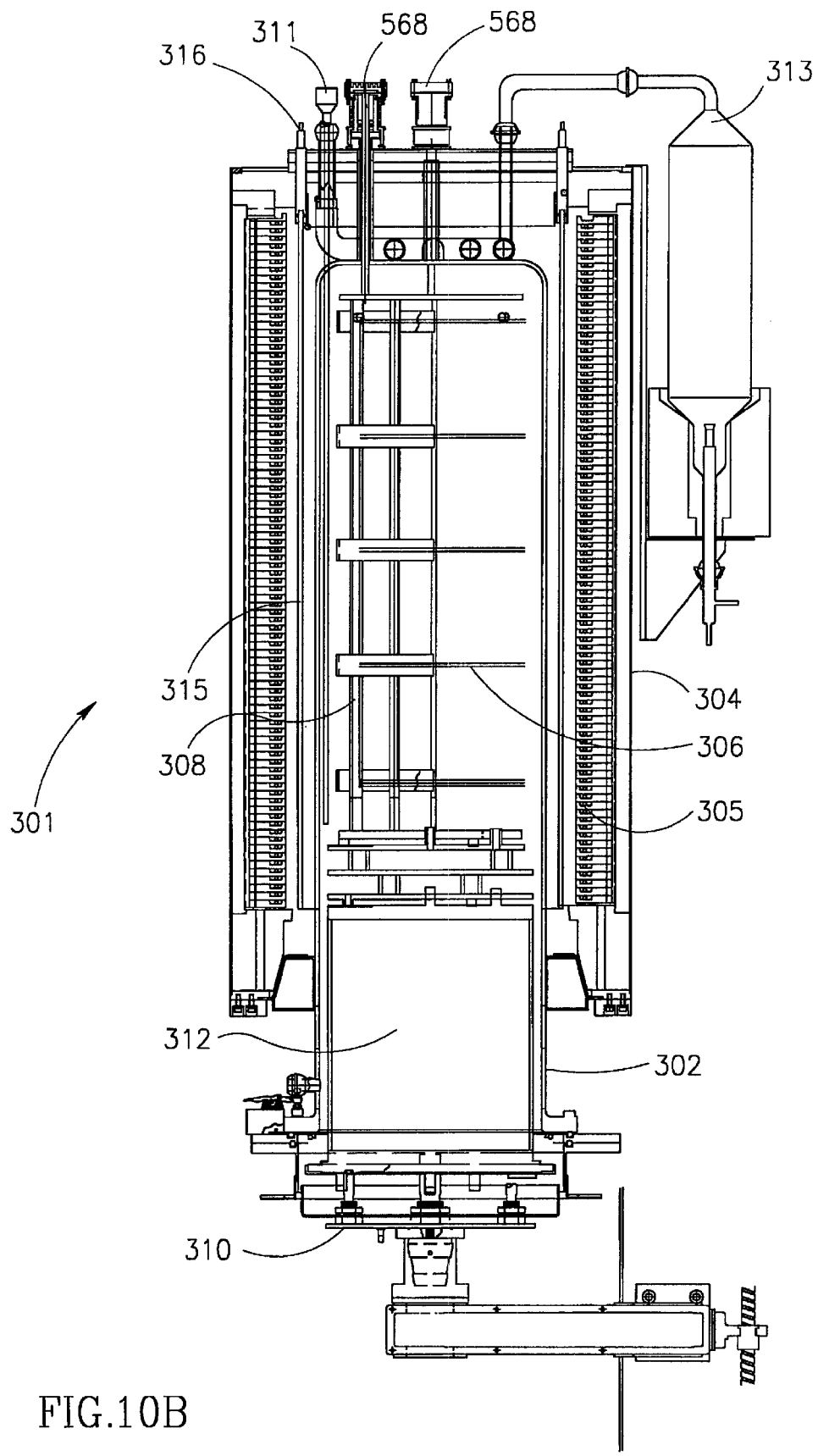
FIG. 10B is a schematic diagram of a top mounted system with an external integrated liner within an alternative vertical semiconductor furnace.

Reference is now made in to FIG. 10B, which illustrates an alternative preferred embodiment of the present invention implemented in a vertical semiconductor furnace 301. Reference is also made in parallel to FIG. 10C, which is an illustration of quartz reaction core 302 and FIG. 10D, which is an illustration of a SiC liner 315 used in the furnaces of FIG. 10B. Elements similar to the embodiment illustrated in FIGS. 10A, 10D are similarly numbered and will not be further described.

In the alternative preferred embodiment illustrated in FIG. 10B, SiC liner 315 is lying in between reaction core 302 and heater element 305, and serves to block the heavy contamination from heater element 305 from penetrating to reaction core 302. SiC liner 315 is lying on one or more quartz hangers 335 (FIG. 10C) mounted on the inside top portion of the reaction core 302.

Transfer device 308 and SiC liner 315 receive their respective voltages via one or more feed-through interfaces 568A and 568B mounted at the top of furnace 300. Alternatively, SiC liner 315 receives voltage via a feed-through interface 316.

Figure 10C:
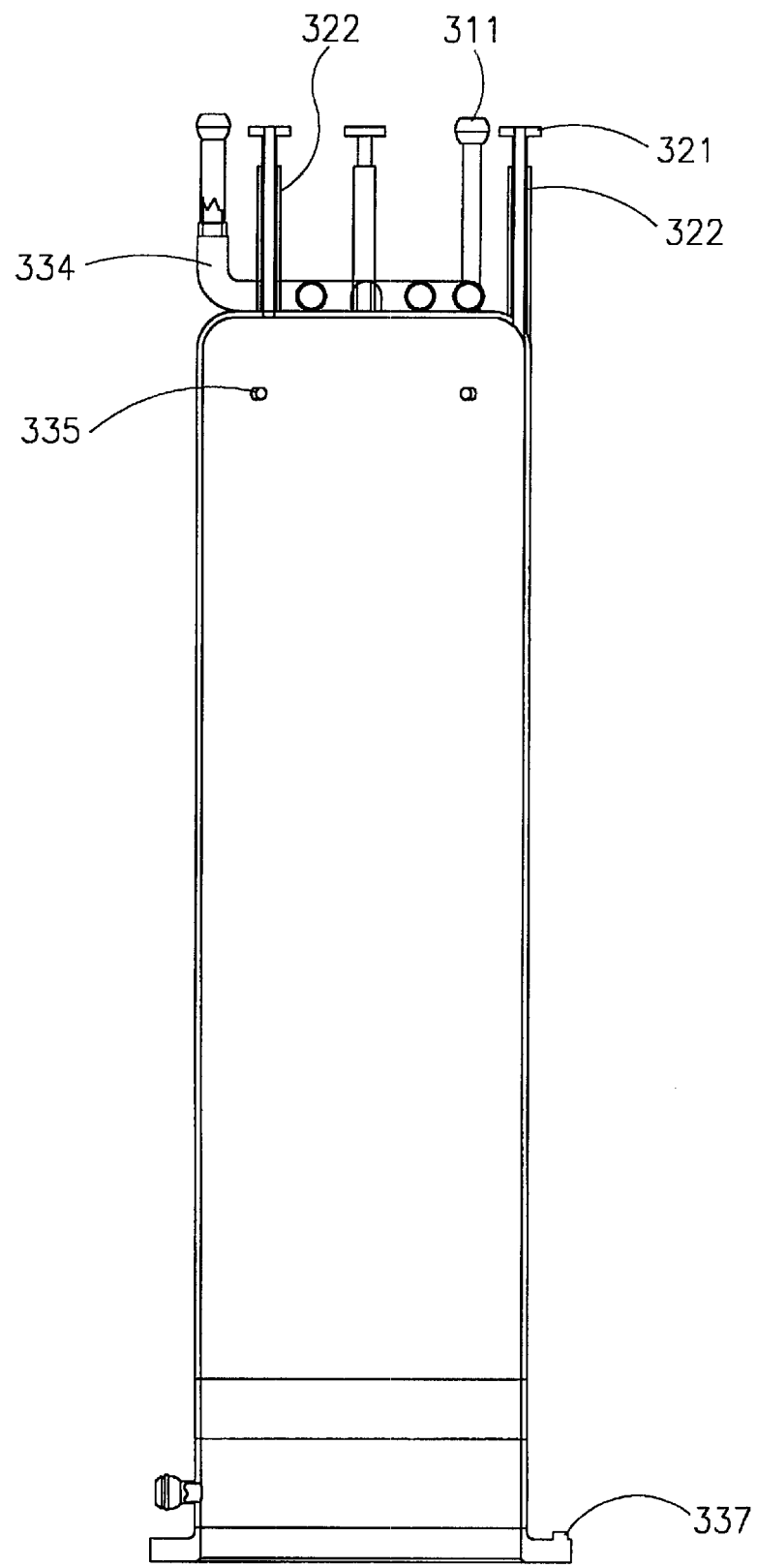
FIG. 10C is a schematic illustration of a preferred embodiment of a quartz tube of the furnace of FIG. 10B.
Figure 10D:
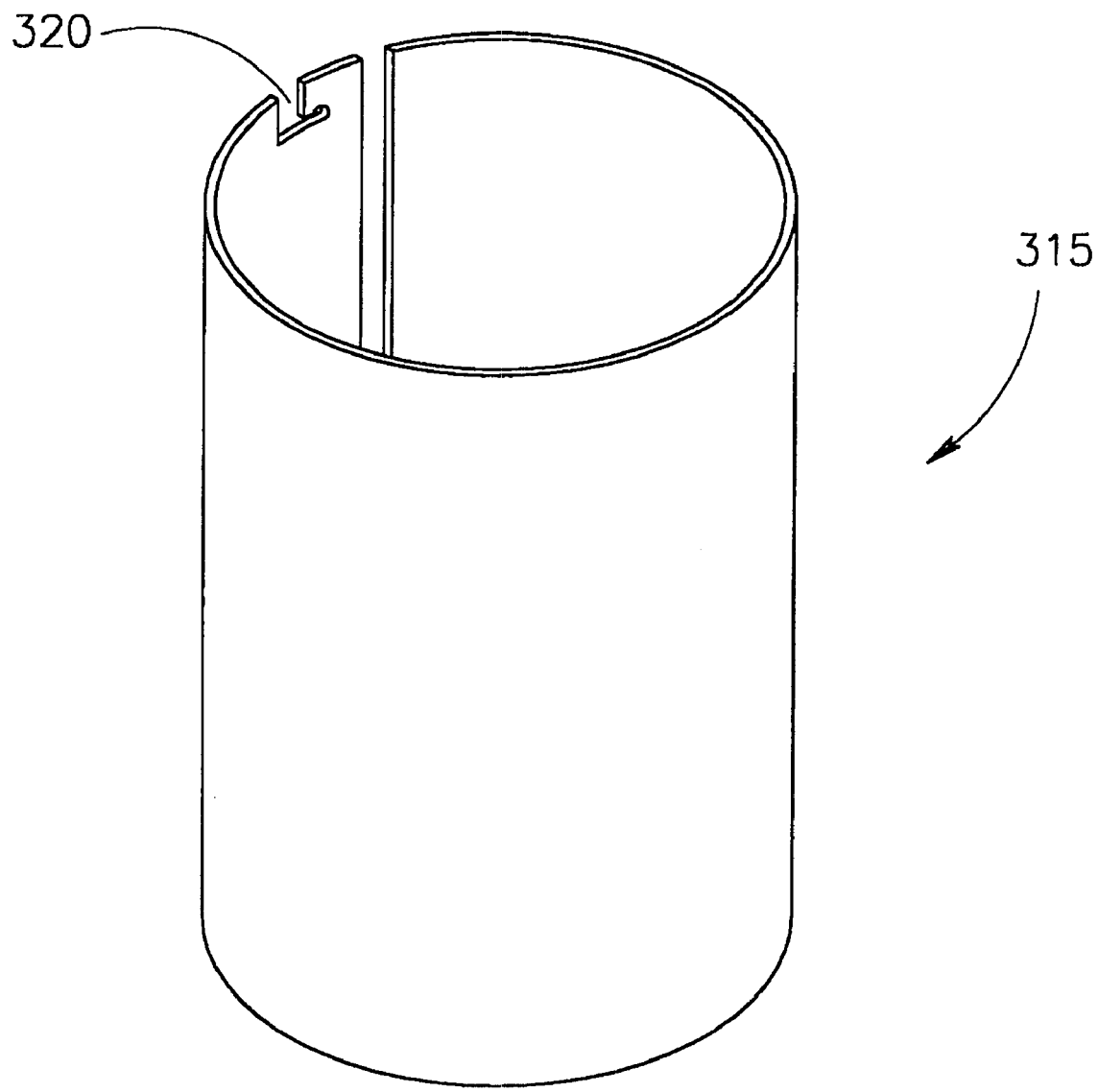
FIG. 10D is a schematic illustration of an internal SiC liner for the furnace of FIG. 10B.

As illustrated in FIG. 10C the bottom portion 337 of vertical quartz reaction core 302 is standard for this alternative furnace, however the upper portion is modified to provide enough space to feed through electrodes, which supply electrical potential to liner 315 or wafers device 308. A modified gas pipe 334 supplies gas to core 302 and is configured such that there is enough space for feed-through interfaces 568A and 568B to be fed therein.

One of the feed-through interfaces 568A or 568B, connects to SiC liner 315 via one or more quartz pipes 321. The quartz pipes 322 support the weight of the feed-through interfaces 568A and 568B. Typically feed-through interfaces 568A and 568B are generally heavy, and quartz pipes 322 prevent horizontal movements, and also isolate the high voltages which are transferred therein from the environment. Via modified quartz pipe 311, it is possible to insert the furnace thermo/couple (T/C) and measure the furnace temperature.

As illustrated in FIG. 10D, SiC liner 315 comprises slits 320 which are used for suspending the liner 315 on the quartz holders 335 (FIG. 10C).

It will be appreciated by persons skilled in the art that the functions of furnaces 300 and 301 are similar and elements therein are exchangeable.

Figure 11A:
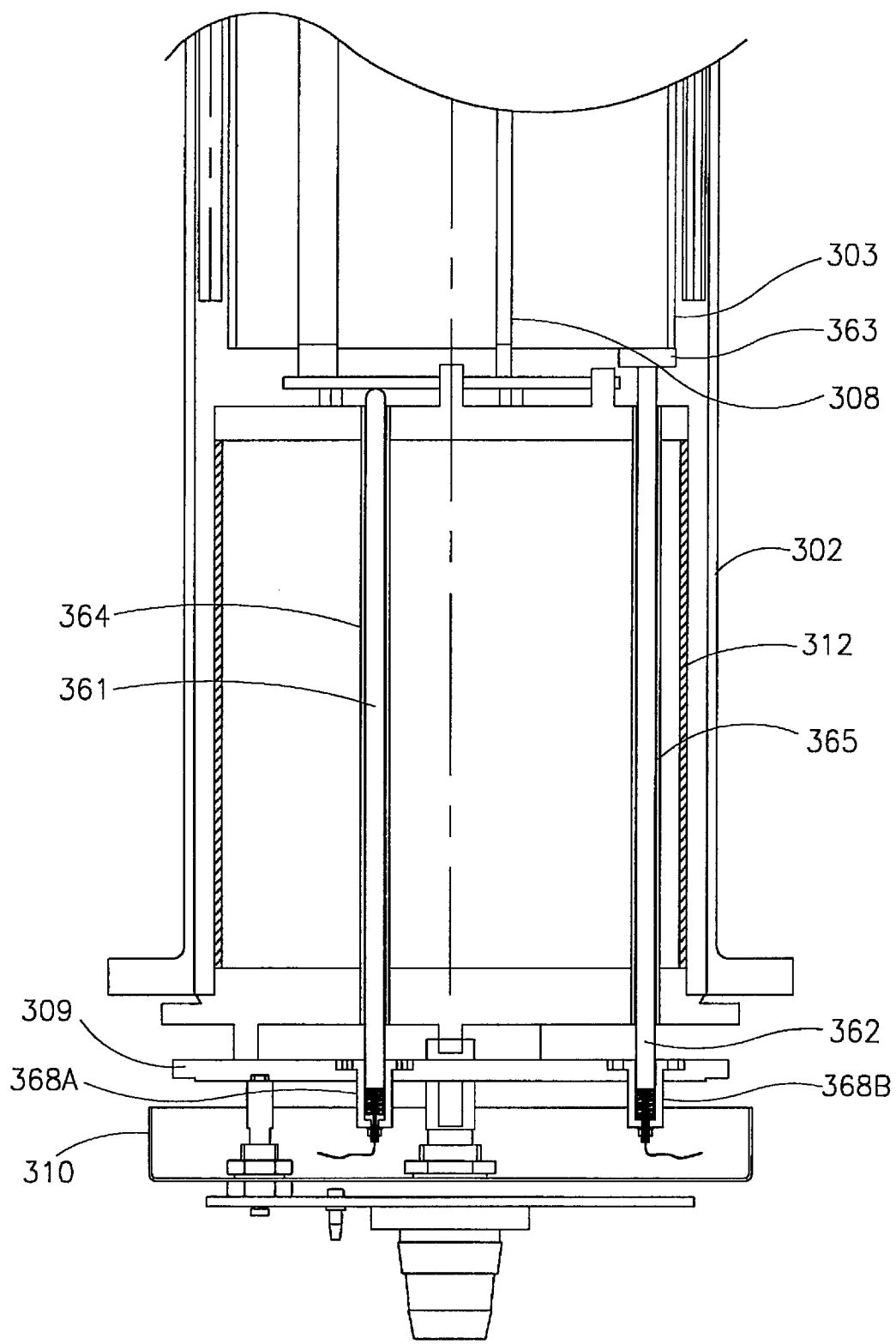
FIG. 11A is a cross sectional view of an alternative bottom mounted system integrated within a vertical semiconductor furnace.
Figure 11B:
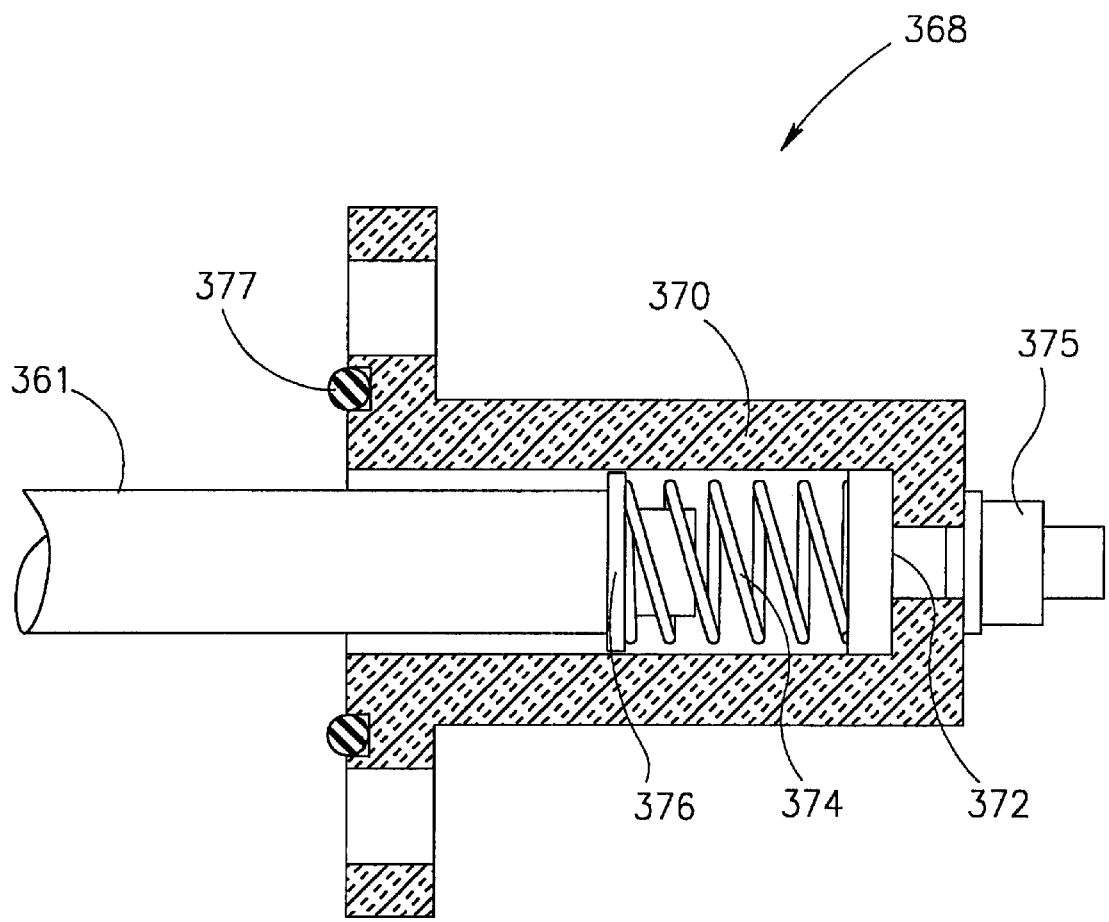
FIG. 11B is a schematic illustration of a feed-through interface employed in the system of FIG. 11A.

Reference is now made to FIG. 11A, which is a detailed view of quartz pedestal 312 and FIG. 11B, which is a detailed view of a lower feed-through interface 368. In an alternative embodiment, lower feed-through interfaces 368 are mounted onto the bottom of a semiconductor furnace. Interfaces 368 are located outside of a metal door 309, which is part of door assembly 310 and supply electrical potential to the elements therein. Feed-through interfaces 368 are made of materials similar to feed through interfaces 568A and 568B and have similar qualities.

The transfer device 308 rests on the quartz pedestal 312. The vertical movement of the wafers device, within the core 302, is carried out via the bottom mechanism. Inner SiC liner 303 is suspended from reaction core 302 (FIG. 10A) and rests on a flat head 363 of a SiC rod 362.

An electrical positive field is supplied to transfer device 308 via a SiC rod 361, which passes through a first cavity 364 located inside pedestal 312. A negative field is supplied to inner SiC liner 303 via SiC rod 362, which passes through a second cavity 365 located inside pedestal 312. SiC rods 361 and 362 are connected to a first and a second feed-through interface, 368A and 368B, respectively, through which the electrical signals are supplied.

Each feed-through interface 368 is formed of a ceramic body 370, an electrical stainless steel connector 372, "O"-rings 377, and a metal spring 374 between connector 372 and an end 376 of the SiC rod 361. Connector 372 is connected to a nut 375, which is typically connected to a power supply (not shown). Feed-through interface 368 functions similarly to feed-through interface 168 described hereinabove and will not be explained further.

Figure 12:
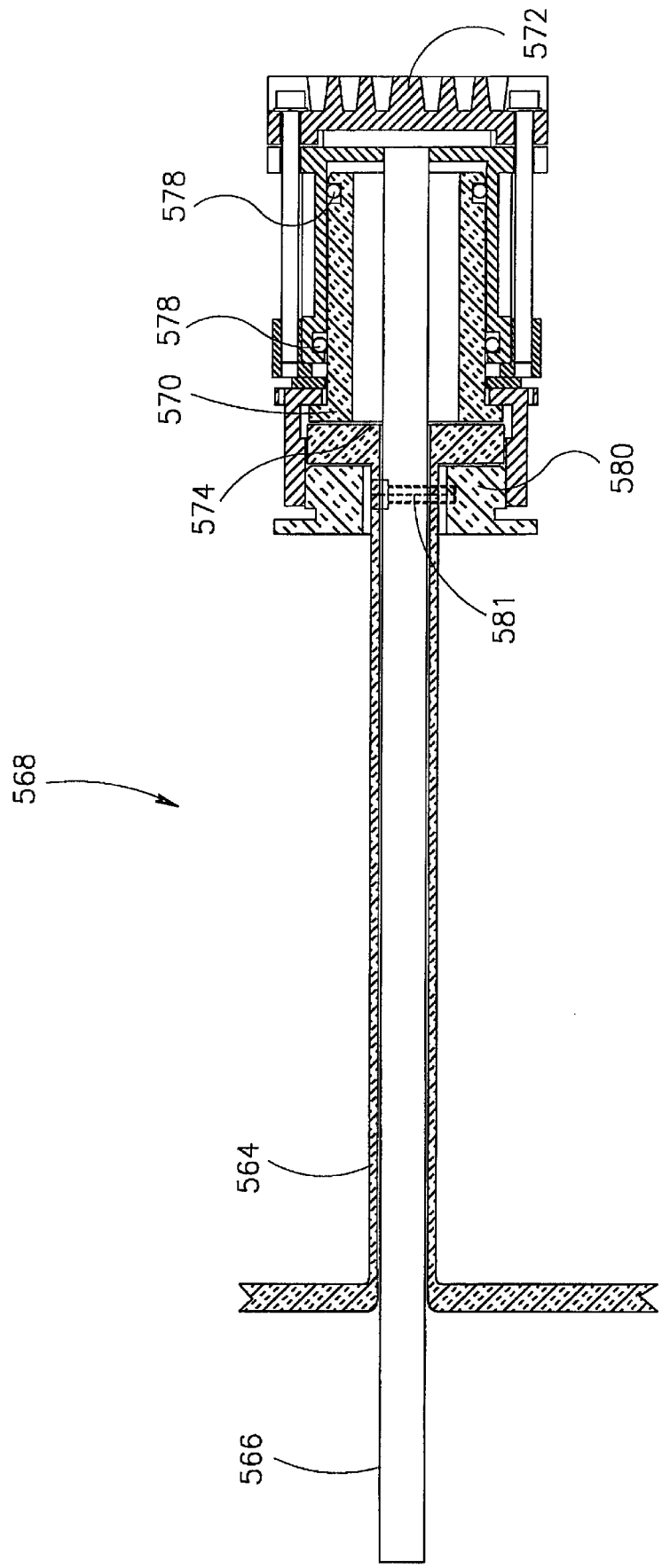
FIG. 12 is a schematic illustration of a preferred embodiment of a top mount feed-through interface for the furnaces of FIGS. 10A and 10B.

Reference is made to FIG. 12, which is an illustration of feed-through interfaces 568, preferably connectable at the top of reaction core 302. In a preferred embodiment there are four feed-through interfaces in the systems illustrated in FIGS. 10A and 10B.

Preferably for proper usage, feed-through interfaces 568A and 568B are employed in two pairs; one pair connectable to the SiC liner 303 and the other pair connectable to the wafer boat 308. One of the interfaces 568A or 568B is connectable to the appropriate voltage supply (either negative or positive, respectively), and the other supplies electrical potential feedback to a controller (shown in FIG. 14A). Hence, each pair acts as an independent feedback system regulating the respective power supplies, positive or negative as applicable.

Each feed-through interface 568 comprises a ceramic body 570, an electrical stainless steel connector 572, electrode extension 566 typically formed of silicon carbide, and "O"-rings 578. The power supply (not shown) is typically connectable to 572. "O"-rings 578 ensure that the feed-through interface 568 seals a through cavity 564 whose end it covers.

Ceramic body 570, formed of a high temperature ceramic, forms an housing around the other elements of the door feed-through interfaces 568. This minimizes contamination into the through quartz cavities 564 and insulates the internal elements of door feed-through interfaces 568 from the heat generated by the furnace. The ceramic body 570 also electrically isolates feed-through interfaces 568 from any electrical activity in the furnace top.

Ceramic body 570 is held against the furnace via a stainless steel piece 580 that fits tightly to the furnace quartz cavity 564, and lies on it vertically. This metal 580 is made of two pieces which are tightened together via screw 581. Thus, the combination of the wafer electrode extensions 566 and door feed-through interfaces 568 provide a continuous electrical connection without the use of thin wires, for a wide range of temperatures.

It will be appreciated that interfaces 568, which are similar to interfaces 168 and 368, are insertable via door 310 and via pedestal 312.

Figure 13:
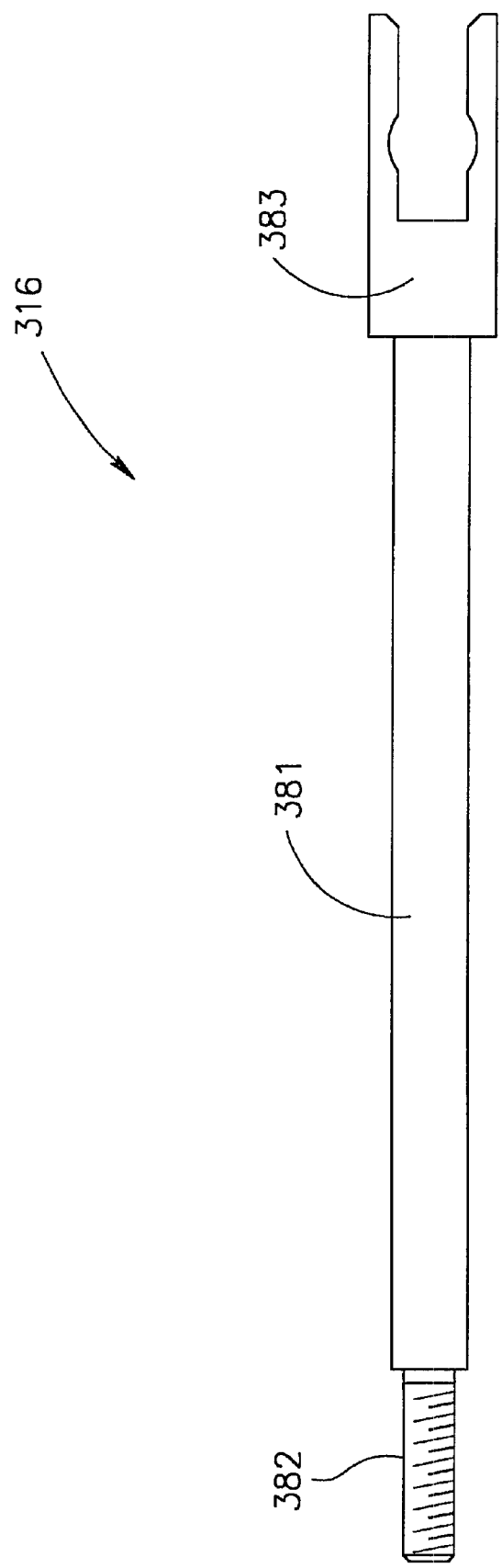
FIG. 13 is a schematic illustration of an alternative embodiment of a feed-through interface for the furnace of FIG. 10B.

Reference is now made to FIG. 13, which illustrates alternative feed-through interface 316 connectable to liner 315 (FIG. 10B). Feed-through interface 316 is formed of SiC and is used to transfer an electrical potential to SiC liner 315 via a connector 383. Connector 383 receives the electrical potential via an electrode extension 381, while the electrical connection to a power supply (not shown) is created via an interface 382.

In a preferred embodiment there are two feed-through interfaces 316 as illustrated in FIG. 10B. Thus, an electrical potential is supplied to liner 315 as well as to the transfer device 308.

Alternatively, in some preferred applications, three potentials are applied, and as such, transfer device 308, liner 315 and liner 303 all receive potentials.

Figure 14A:
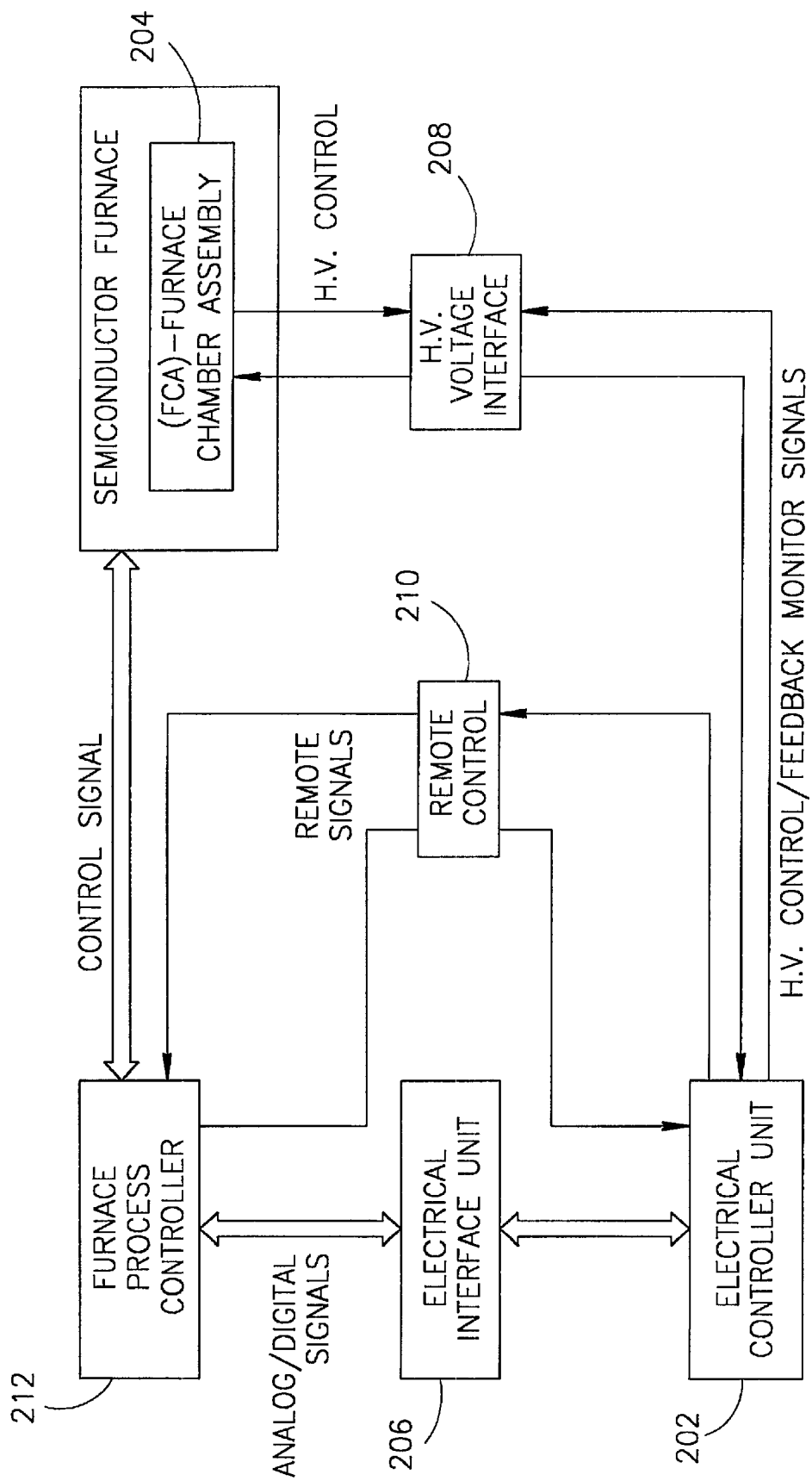
FIGS. 14A and 14B are block diagrams of the electronics of the system illustrated in FIGS. 10A–B.

Reference is now made to FIG. 14A, a schematic diagram of the electronic architecture of the wafer cleaning/protection system described in FIGS. 10A and 10B, operative according to a preferred embodiment of the present invention. The architecture comprises a controller 202, a furnace chamber assembly (FCA) 204, an interface unit 206, a high voltage interface unit 208, a remote control unit 210, and a furnace process controller 212.

Figure 14B:
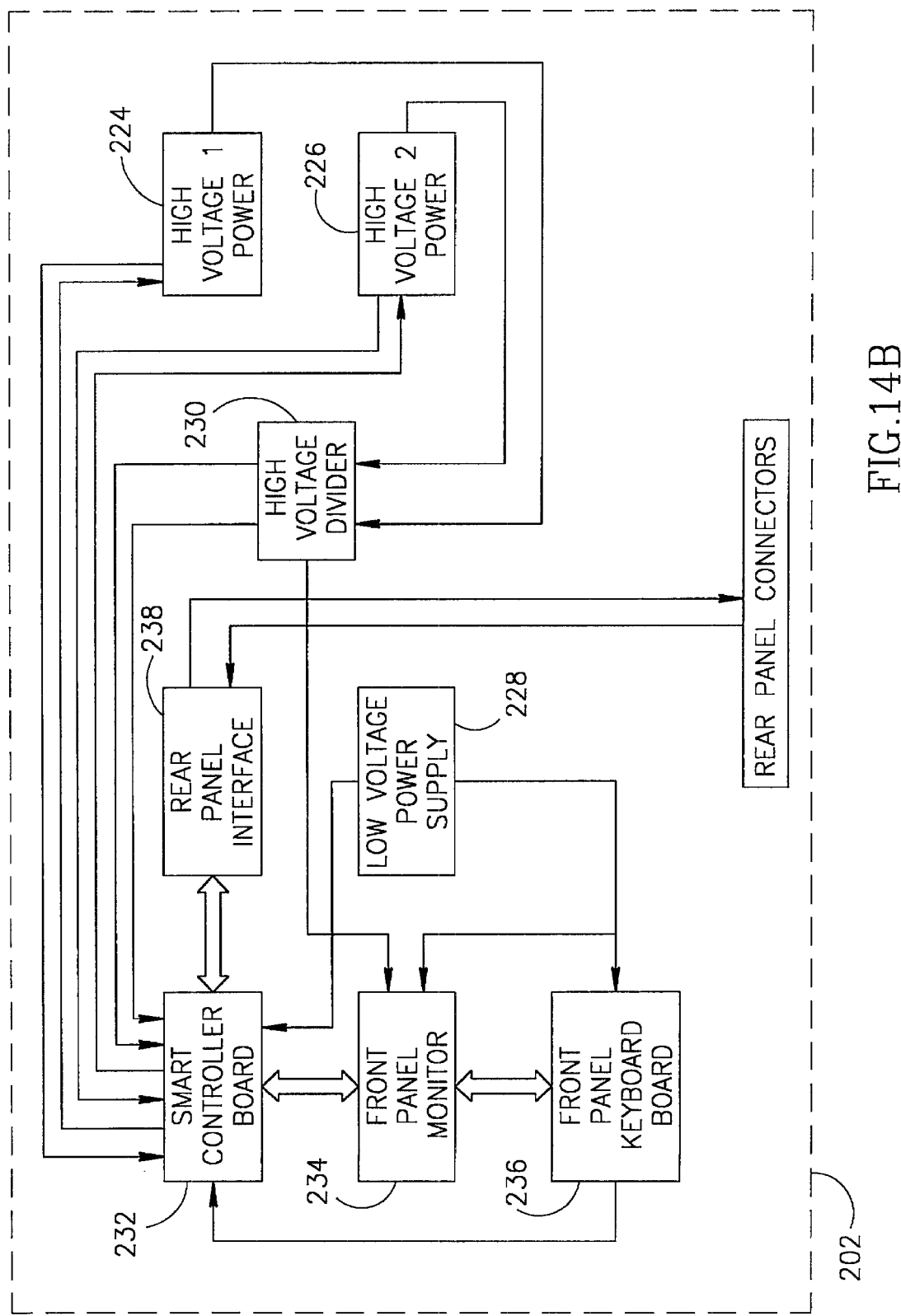

Controller 202 supplies and controls the high voltage required by the architecture. Controller 202 is either operated manually via a front panel board 236 (FIG. 14B) or remotely via remote control unit 210 and furnace process controller 212.

FCA 204, which is alternatively a furnace tube assembly, is similar in function to FCAs 300 and 301 described hereinabove in detail in reference to FIGS. 10A and 10B, respectively. As in those embodiments, FCA 204 includes all the electrodes and feed-through interfaces required for application of the electric fields as described in detail hereinabove. As described above, preferably a common feature in FCA 204 is two contacts for each electrode: one for power supply to the electrode and the other for feedback, supporting self-test integrity for each electrode.

One electrode in the furnace will connect to the wafers, arranged in a SiC transfer device. The other electrodes may be of different form, connectable to either a SiC process tube, a SiC liner, a metal grid surrounding the quartz process tube, or connectable to the furnace heating element In addition, many internal signals used in the controller 202 are connected to interface unit 206 to facilitate a handshaking algorithm with the furnace controller and easy troubleshooting and calibration of the system.

Interface unit 206 contains the feed-through interfaces and matching circuitry for transfer of the command signals to and from the process controller 212. Preferably, furnace process controller 212 has both analog and digital channels connections to interface unit 206. Additionally, interface unit 206 connects furnace process controller 212 to controller 202 and provides interface for all command and feedback signals therein.

High voltage interface unit 208 connects furnace FCA 204 to controller 202 and interfaces all command and feedback high voltage signals therein.

Remote control unit 210 provides feedback from controller 202 to furnace process controller 212, and processes all commands and feedback from an operator, controller. Alternatively, controller 202 is located in a location separate from wafer cleaning/protection system, such as a clean room.

Preferably all the referenced elements are connected with cables and feed-through interfaces, which are standard communication high voltage issue, and capable of supplying the electrical field properly without an external discharge/leakage.

Controller 202 is alternatively a stand-alone or panel unit mounted on an existing furnace controller's frame. Preferably the architecture comprises a furnace emergency off located in the remote control 210, which polices the electrical input and shuts off the power to controller 202, if necessary.

Controller 202 is alternatively manually controlled, or automatically controlled from the furnace process controller 212. For diagnostics and external control, controller 202 is serially interfaced to a PC.

Controller 202 preferably has a series of safety features such as a high-voltage indicator light in the FCA 204, a high voltage interlocked furnace door switch, built-in protection from over-voltage or short-circuit conditions, real-time voltage/current monitoring, real-time voltage/current feedback to furnace process controller 212. Controller 202 preferably also has self-testing for discontinuities in the electrical path, audio buzzer indication in error situations, and alarm system monitored locally and remote.

Additionally preferably. controller 202 has internal protection from over-voltage, such as wrong set point or hardware problems, and from over-current, such as shorts, leakages, discharges etc. Controller 202 shuts down the high-voltage generator when hardware limits are exceeded and causes an alarm to sound when a pre-set high voltage limit, lower than a maximum limit, is exceeded.

Controller 202 performs on-line self-test for high-voltage generator performance and for high voltage path continuity, and generates an alarm in cases of failure. Furnace process controller 212 has full control of the furnace operation.

Reference is now made to FIG. 146, a block diagram of controller 202, shown in FIG. 14A. Controller 202 comprises a smart controller board 232 which controls the output/inputs sequences, defines the work methods (either manual or remote), communications with the other furnace components, and activates alarms, if necessary.

Controller 202 further comprises two high voltage power supplies 224 and 226, a low voltage power supply 228, a high voltage divider 230, smart control board 232, a front panel monitor board 234 and a front panel keyboard board 236.

High voltage power supplies 224 and 226 are controlled by smart control board 232. Low voltage power supply 228 provides low voltages to boards 232, 234 and 236. High voltage divider 230 supplies the feedback from the power supplies 224 and 226 to controller board 232.

Monitor board 234 monitors the supplied voltages, feedback's currents, and working sequences. Keypad 236 provides manual control of controller 202, implements either manual or remote working methods and enables furnace process controller over-ride.

It will be appreciated by persons skilled in the art that the present invention is not limited by what has been particularly shown and described here in above. Rather the scope of the invention is defined by the claims that follow.

What is claimed is:

1. A method for removing free ions from at least one wafer, the method comprising:
   heating said at least one wafer in an apparatus for semiconductor processing having a reaction core;
   providing a first voltage level to said at least one wafer; and
   providing a second voltage level, lower than said first voltage level, near said reaction core, thereby activating said protection.

2. A method according to claim 1 and wherein the step of heating said at least one wafer is carried out in a semiconductor furnace.

3. A method according to claim 1, further comprising the step of operating a cooling system within said apparatus.

4. A method according to claim 1, further comprising the step of pulling a vacuum within said apparatus.

5. An apparatus for protecting at least one wafer from external free ion contamination, the apparatus comprising:
   a reaction core which processes said at least one wafer;
   a heating element located on the outside of said reaction core which heats-up said at least one wafer and said reaction core; and
   a means for supplying an electrical potential, said means supplies a first voltage level to said at least one wafer; and a second voltage level, lower than said first voltage level, near said reaction core.

6. An apparatus according to claim 5, wherein said reaction core is located within equipment for semiconductor production.

7. An apparatus according to claim 5, wherein said reaction core is located within equipment for silicon wafer processing.

8. An apparatus according to claim 5, wherein said reaction core is located within a semiconductor furnace.

9. An apparatus according to claim 5, further comprising a cooling system which cools said reaction core.

10. An apparatus according to claim 9, wherein said cooling system comprises at least one blower.

11. An apparatus according to claim 5, wherein said heating element is one or more IR lamps.

12. An apparatus according to claim 5, further comprising a grid-shaped core collector electrode wrappable around the outside of said reaction core.

13. An apparatus according to claim 12, wherein said electrode is formed of a thermo-stable material.

14. An apparatus according to claim 12, wherein said electrode is formed of one of the following; Aluchrom and Silicon Carbide.

15. An apparatus according to claim 12, further comprising a vacuum pump, which draws a vacuum within said reaction core.

16. A wafer transfer device for holding a plurality of wafers within a furnace having a door, the device comprising:
   a support formed of SiC, and having a base and a plurality of prongs, wherein each, one of said plurality of wafers stands between a pair of said plurality of prongs, and;

at least one electrode which supplies an electrical potential to said support.

17. A device according to claim 16, wherein said electrode is made from silicone carbide (SiC).

18. A device according to claim 16, wherein said electrode is made having a comb-like shape.

19. A device according to claim 16, further comprising:

a hook connected to said at least one support; and a protrusion from said door, wherein said hook hooks to said protrusion and suspends said device therefrom.

20. A device according to claim 19, wherein said hook is made from quartz.

21. A furnace which minimizes contamination of at least one silicone wafer processed therein, the furnace comprising;

at least one feed-through interface which passes though an associated at least one opening in said furnace, said interface having a first end outside of said furnace and a second end extended into said furnace, wherein said first end is connectable to an electrode which receives an electrical potential, and;

at least one electrode extensions which extends from an associated at least one feed-through interface into said furnace, wherein said extension is connectable to said second end of said interface, wherein said interface seals said associated opening and prevents said electrical potential from leaking from said extension.

22. A furnace according to claim 21, further comprising a wafer transfer device which holds said at least one wafer, and is connectable to said at least one electrode extension and receives said electrical potential therefrom.

23. A furnace according to claim 21, wherein said furnace is vertical.

24. A furnace according to claim 21, wherein said furnace is horizontal.

25. A furnace according to claim 21, further comprising a reaction core which processes said at least one wafer.

26. A furnace according to claim 21, further comprising a furnace door, wherein said at least one feed-through interface passes though an associated at least one opening in said furnace door, and seals said opening.

27. A furnace according to claim 26, wherein said furnace door comprises a door-insulating unit connected to said door.

28. A furnace according to claim 21, wherein said at least one feed-through interface passes though said associated at least one opening in at least one of the following places: at the top of the furnace and at the bottom of the furnace.

29. A furnace according to claim 21, further comprising a liner which acts as a core collector for said contamination.

30. A feed-through interface which carries an electrical potential, said interface comprising:

a conductive tip connectable to a power supply which supplies said electrical potential;

a conductive spring having a first end and a second end, wherein said first end is connected to said tip;

an electrode extension connected to said second end of said spring, and wherein said potential of provided from said tip to said spring to said electrode extension; and a high temperature body which surrounds said interface and prevents said electrical potential from leaking.

31. A feed-through interface according to claim 30 wherein said body is made from ceramic.

* * * * *